US012615748B2

(12) United States Patent
Li

(10) Patent No.: US 12,615,748 B2
(45) Date of Patent: Apr. 28, 2026

(54) POWER CONVERTER

(71) Applicant: FUJI ELECTRIC CO., LTD.,
Kanagawa (JP)

(72) Inventor: Mengyu Li, Tokyo (JP)

(73) Assignee: FUJI ELECTRIC CO., LTD.,
Kawasaki (JP)

( * ) Notice: Subject to any disclaimer, the term of this patent is extended or adjusted under 35 U.S.C. 154(b) by 224 days.

(21) Appl. No.: 18/479,203

(22) Filed: Oct. 2, 2023

(65) Prior Publication Data

US 2024/0128885 A1      Apr. 18, 2024

(30) Foreign Application Priority Data

Oct. 17, 2022     (JP) ................................. 2022-166144

(51) Int. Cl.
| | |
|---|---|
| *H05K 7/20* | (2006.01) |
| *H02K 9/00* | (2006.01) |
| *H02M 7/00* | (2006.01) |

(52) U.S. Cl.
CPC .............. *H05K 7/209* (2013.01); *H02K 9/00* (2013.01); *H02M 7/003* (2013.01)

(58) Field of Classification Search
None
See application file for complete search history.

(56) References Cited

U.S. PATENT DOCUMENTS

| | | | | |
|---|---|---|---|---|
| 9,474,189 | B2 * | 10/2016 | Kawauchi | .......... H05K 7/20436 |
| 10,177,675 | B2 * | 1/2019 | Numakura | ............... H05K 7/02 |
| 11,758,698 | B2 * | 9/2023 | Lee | ...................... H05K 5/0217 |
| | | | | 361/715 |
| 12,143,026 | B2 * | 11/2024 | Nakata | ............... H05K 7/20445 |
| 12,302,500 | B2 * | 5/2025 | Abe | ...................... H05K 1/0263 |
| 2013/0223009 | A1 * | 8/2013 | Nakatsu | .................. B60L 3/003 |
| | | | | 361/699 |
| 2014/0286064 | A1 * | 9/2014 | Kamizuma | .............. H01G 2/08 |
| | | | | 361/301.5 |
| 2022/0142014 | A1 * | 5/2022 | Ono | .......................... H02B 1/48 |
| | | | | 361/699 |
| 2024/0223100 | A1 * | 7/2024 | Nishikimi | ............... H02M 1/14 |

FOREIGN PATENT DOCUMENTS

| | | |
|---|---|---|
| JP | 2019-024319 | 2/2019 |
| JP | 2021-197838 | 12/2021 |

OTHER PUBLICATIONS

Office Action mailed on May 16, 2023 issued with respect to the corresponding Japanese Patent Application No. 2022-166144.

* cited by examiner

*Primary Examiner* — Courtney L Smith
(74) *Attorney, Agent, or Firm* — IPUSA, PLLC

(57)      ABSTRACT

A power converter includes a semiconductor module with a switching element, a DC terminal, and an AC terminal, and includes a capacitor module with a capacitor terminal coupled to the DC terminal of the semiconductor module. The power converter includes a cooling module. The cooling module has a first cooling surface provided to face the heat dissipation portion, and has a second cooling surface provided to face the DC terminal or the capacitor terminal. The cooling module has a third cooling surface extending in a direction intersecting each of the first cooling surface and the second cooling surface, the third cooling surface being configured to cool the capacitor module.

8 Claims, 19 Drawing Sheets

POWER CONVERTER

CROSS-REFERENCE TO RELATED APPLICATION

This application claims priority under 35 U.S.C. § 119 to Japanese Patent Application No. 2022-166144, filed on Oct. 17, 2022, the contents of which are incorporated herein by reference in their entirety.

BACKGROUND

1. Technical Field

The present disclosure relates to a power converter.

2. Description of the Related Art

Power converters are mounted on an electric vehicle in which a motor is used as a drive source. An example of the power converters is an inverter that converts DC power from a battery into AC power supplied to a motor. The inverter is known to include a semiconductor module, a capacitor module and a cooler for cooling the semiconductor module, where the semiconductor module is equipped with a switching element for performing power conversion, and the capacitor module includes a capacitor element for smoothing a DC voltage. A ripple current flows through the capacitor element due to switching of the semiconductor module, and thus the capacitor element itself consumes power and generates heat. Furthermore, the capacitor element is connected to the semiconductor module via a bus bar. In this case, when the temperature of the semiconductor module becomes high, heat is transferred from the semiconductor module to the capacitor element via the bus bar, and thus the transferred heat causes the temperature of the capacitor element to become high as well.

In many cases, a compact, high-capacitance and high-precision film capacitor is used in an inverter for an electric vehicle. However, the heat-resistant temperature of such a film capacitor is lower than that of a semiconductor module or the like, and thus deterioration of the film capacitor is accelerated in a high-temperature state. As the output density of the power converter increases, the internal temperature of the capacitor increases significantly. There lies a challenge to address the increased temperature of the capacitor element.

In view of the situation described above, in Patent Documents 1 and 2, a cooling structure for cooling a bus bar that is electrically connected to a capacitor element is included with a capacitor module to suppress the increase in the temperature of the capacitor element.

Patent Document 1 discloses a power converter including a semiconductor module, a capacitor module, and a cooler. Patent Document 1 also discloses that the capacitor module includes a heat dissipating metal body thermally connected to the cooler inside a capacitor case.

Patent Document 2 discloses a power converter including a capacitor and heat dissipation portions disposed on both surfaces of the capacitor to cool the capacitor. In Patent Document 2, it is also disclosed that the capacitor includes a capacitor element, an electrode portion formed on the capacitor element, a bus bar connected to the electrode portion, and a resin member sealing the capacitor element and a part of the bus bar. Further, it is disclosed that the bus bar is formed to protrude from the resin member in a direction orthogonal to an arrangement direction in which the heat dissipation portions and the capacitor are arranged, and has an exposed portion electrically connected to the outside. Furthermore, Patent Document 2 discloses that the exposed portion is formed so as to protrude from the resin member on the side closer to the heat dissipation portion than the center portion of the capacitor in the arrangement direction.

RELATED-ART DOCUMENTS

Patent Documents

[Patent Document 1] Japanese Unexamined Patent Application Publication No. 2021-197838
[Patent Document 2] Japanese Unexamined Patent Application Publication No. 2019-024319

SUMMARY

In one aspect of the present disclosure, a power converter is provided. The power converter a semiconductor module including a switching element, a DC terminal, an AC terminal, and a heat dissipation portion. The power converter includes a capacitor module including a capacitor terminal coupled to the DC terminal of the semiconductor module. The power converter includes a cooling module having a first cooling surface provided to face the heat dissipation portion, a second cooling surface provided to face the DC terminal or the capacitor terminal, and a third cooling surface extending in a direction intersecting each of the first cooling surface and the second cooling surface, the third cooling surface being configured to cool the capacitor module.

DETAILED DESCRIPTION

Figure 1:
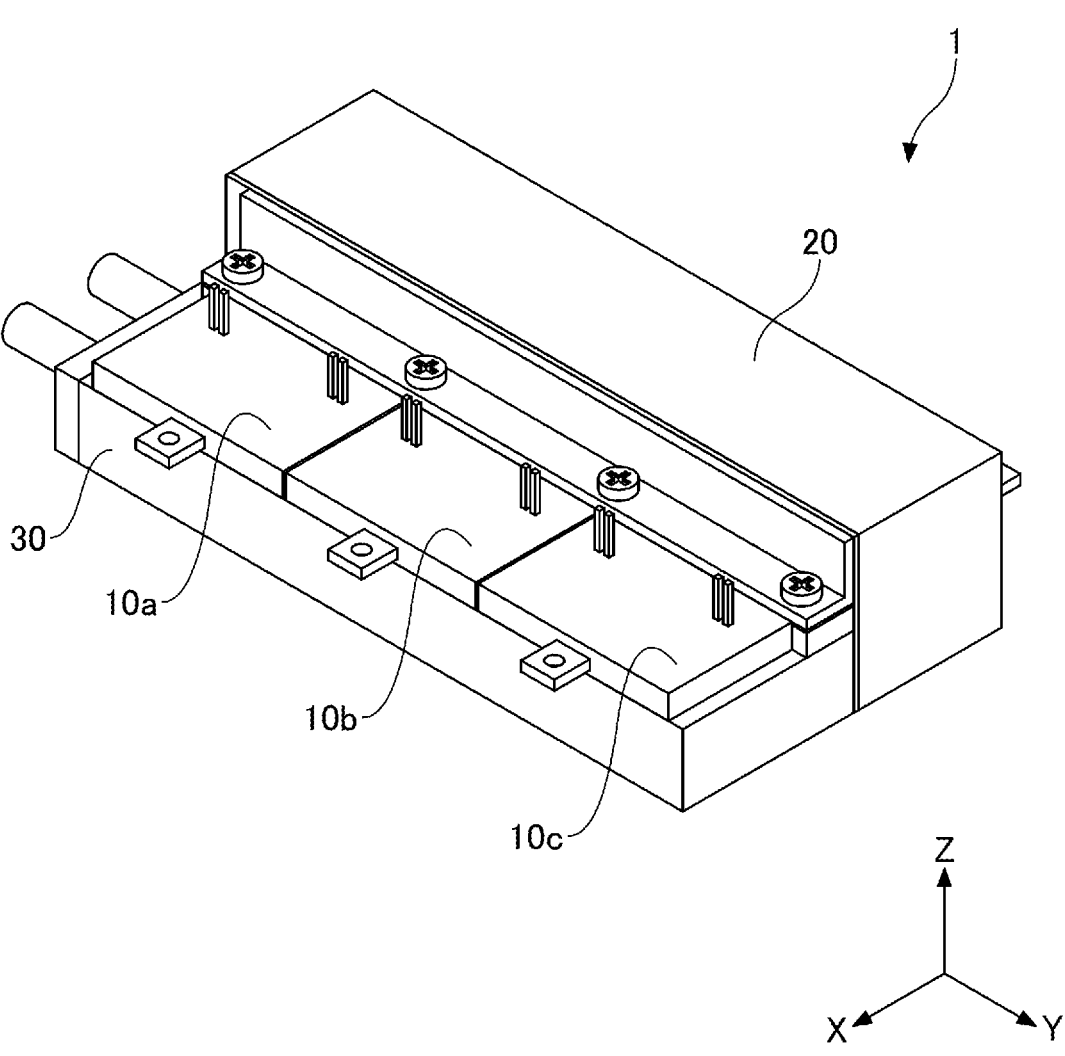
FIG. 1 is a perspective view of a power converter according to the present embodiment.

Related art information relevant to the present disclosure recognized by the inventor of this application is provided below. In the power converter described in Patent Document 1, a heat dissipation plate is provided in proximity to the bus bar for releasing heat transferred from the semiconductor module and the bus bar. However, since the heat of the bus bar is transferred to a cooling body via a filling resin and the heat dissipation plate, a path for dissipating heat is long and the heat dissipation effect is limited.

In the power converter described in Patent Document 2, for reducing the increase in the temperature due to joule heat generated in the capacitor element, a cooling body is brought into close contact with the electrode portion, and it has achieved efficient heat dissipation. On the other hand, the structures of the resin member and the internal bus bar of the capacitor become complicated, and there are concerns about a decrease in the cross-sectional area of the bus bar, an increase in wiring resistance and wiring impedance due to an increase in the length thereof, an increase in switching loss due to the increase in wiring resistance and wiring imped- ance, and an increase in heat generation of the semiconduc- tor module.

Furthermore, as in the power converters described in Patent Documents 1 and 2, the method of providing the capacitor module with a cooling mechanism has problems of an increase in the volume of the power converter and an increase in the manufacturing cost.

For the power converter, it is required to achieve effective heat dissipation without incorporating a cooling mechanism in a capacitor module, and to reduce the size and manufac- turing cost of the power converter.

In view of the issues recognized by the inventor, the present disclosure provides a power converter that achieves effective heat dissipation.

Hereinafter, one embodiment will be described with ref- erence to the accompanying drawings. Note that the present disclosure is not limited to these examples, but is defined by the scope of the claims and is intended to include all modifications within the meaning and scope equivalent to the scope of the claims.

In the specification and the drawings of the embodiment, components having substantially the same or corresponding functional configurations are denoted by the same reference numerals, and redundant description thereof may be omitted. For ease of understanding, the scale of each part in the drawings may be different from the actual scale.

In directions such as parallel, perpendicular, orthogonal, horizontal, vertical, up-and-down, left-and-right, and front- and-rear, deviations are allowed to such an extent that the effects of the embodiment are not impaired. The shape of a corner portion is not limited to a right angle and may be rounded. Parallel, perpendicular, orthogonal, horizontal, and vertical may include substantially parallel, substantially perpendicular, substantially orthogonal, substantially hori- zontal, and substantially vertical, respectively.

For example, "substantially parallel" means that even if two lines or two surfaces are not completely parallel to each other, the two lines or two surfaces can be treated as being parallel to each other within an allowable range in manu- facturing. It is intended that, substantially perpendicular, substantially orthogonal, substantially horizontal, and sub- stantially vertical may be considered, similarly to the sub- stantially parallel, applicable, as long as the positional relationship between the two lines or two surfaces are within an allowable range in manufacturing, similarly to the sub- stantially parallel.

<Power Converter>

Figure 2:
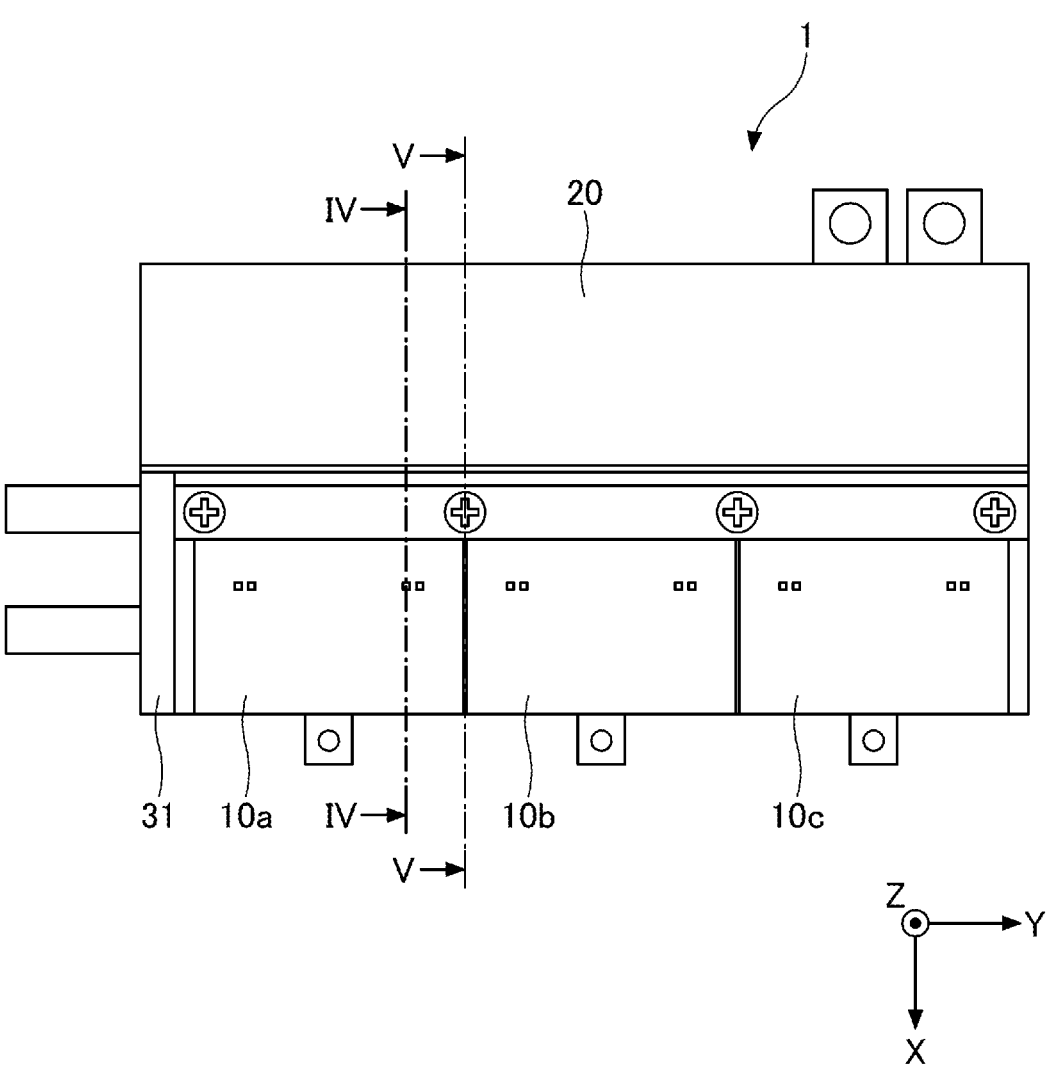
FIG. 2 is a top view of the power converter according to the present embodiment.
Figure 3:
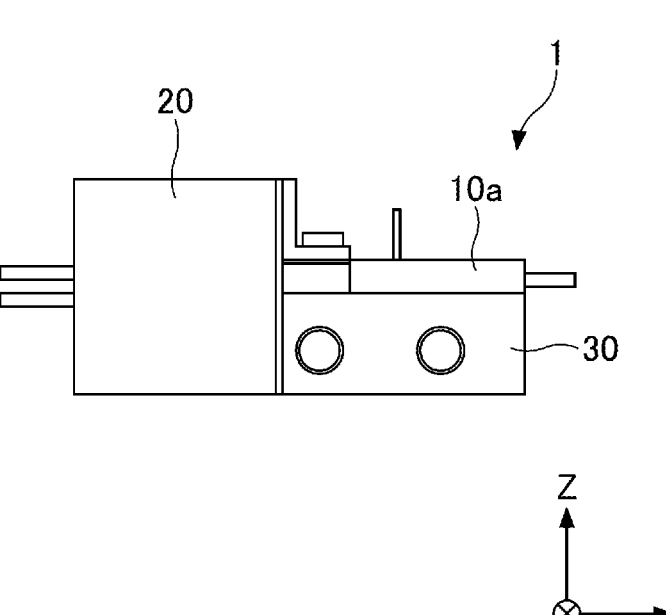
FIG. 3 is a side elevational view of the power converter according to the present embodiment.

A power converter according to the present embodiment will be described. FIG. 1 is a perspective view of a power converter 1 which is an example of the power converter according to the present embodiment. FIG. 2 is a top view of the power converter 1 which is the example of the power converter according to the present embodiment. FIG. 3 is a side elevational view of the power converter 1 which is the example of the power converter according to the present embodiment.

In the drawings, for convenience of description, a virtual three dimensional coordinate system (XYZ orthogonal coor- dinate system) including an X axis, a Y axis, and a Z axis (XYZ axes) orthogonal to each other is set. For example, regarding a coordinate axis perpendicular to the paper plane of the drawing, when a black circle is illustrated in a circle between the coordinate axis, this indicates that the front side with respect to the paper plane of the drawing is a positive region of the coordinate axis. Whereas, when a cross mark is illustrated in a circle between the coordinate axis, this indicates that the front side with respect to the paper plane is a negative region of the coordinate axis.

However, the coordinate system is determined for description and does not limit the orientation of the power converter or the like according to the present embodiment.

In the following drawings, the X-axis direction is a direction in which a semiconductor module 10a, a semiconductor module 10b, and a semiconductor module 10c, and a capacitor module 20 are arrayed. The Y-axis direction is a direction in which the semiconductor module 10a, the semiconductor module 10b, and the semiconductor module 10c are arrayed. The Z-axis direction is a direction perpendicular to the X-axis direction and the Y-axis direction.

In the X-axis direction, a drawing of an object viewed from the +X side to a direction opposite to the X-axis is referred to as a front elevational view, and a drawing of an object viewed from the −X side to the same direction as the X-axis is referred to as a rear elevational view. In the X-axis direction, a view of an object viewed from the +X side to a direction opposite to the X-axis is referred to as a front view, and a view of an object viewed from the −X side to the same direction as the X-axis is referred to as a rear view. In the Y-axis direction, a drawing of an object viewed from the −Y side to a direction opposite to the Y-axis is referred to as a side elevational view. In the Z-axis direction, a drawing of an object viewed from the +Z side to a direction opposite to the Z-axis is referred to as a top view, and a drawing of an object viewed from the −Z side to the same direction as the Z-axis is referred to as a bottom elevational view. In the Z-axis direction, a view of an object viewed from the +Z side to the direction opposite to the Z-axis is referred to as a top view.

Based on the front elevational view, the X-axis direction may be referred to as a front-and-rear direction, the Y-axis direction may be referred to as a left-and-right direction, and the Z-axis direction may be referred to as an up-and-down direction. With respect to a target, the +X side may be referred to as a front side, the −X side may be referred to as a rear side, the +Y side may be referred to as a right side, the −Y side may be referred to as a left side, the +Z side may be referred to as an upper side, and the −Z side may be referred to as a lower side.

The power converter 1 converts DC power into AC power. The power converter 1 is used in, for example, an electric vehicle in which a motor is used as a drive source. The power converter 1 converts, for example, DC power supplied from a battery into AC power for driving a motor. The power converter 1 is, for example, an inverter.

The power converter 1 includes the semiconductor module 10a, the semiconductor module 10b, the semiconductor module 10c, the capacitor module 20, and a cooling module 30.

Figure 4:
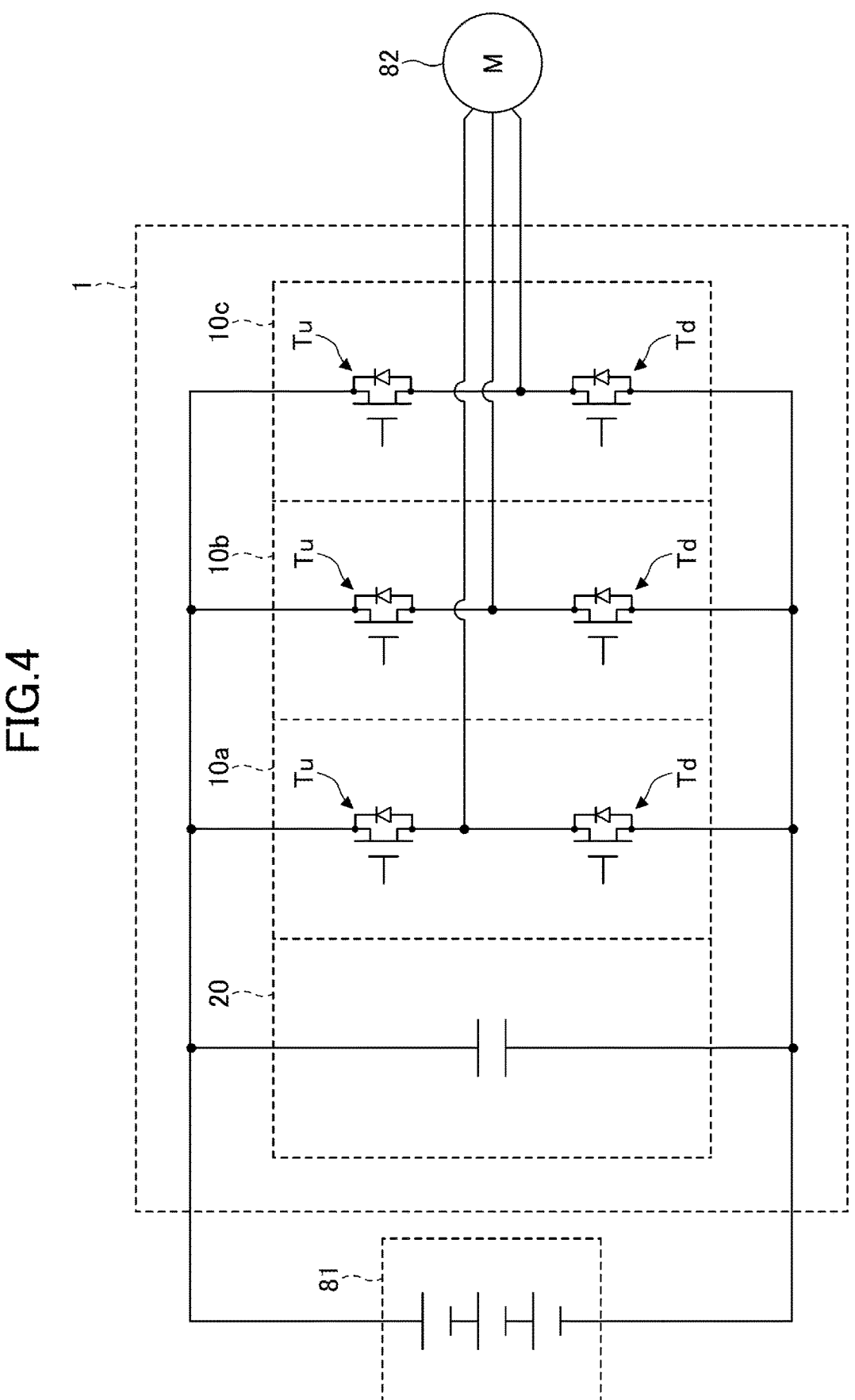
FIG. 4 is a diagram illustrating electrical connection in the power converter according to the present embodiment.

A usage state of the power converter 1 will be described. FIG. 4 is a diagram illustrating electrical connection in the power converter 1 which is the example of the power converter according to the present embodiment. The power converter 1 converts DC power from a DC power supply 81 into AC power, and supplies the AC power to a motor 82.

The DC power supply 81 is connected to the capacitor module 20. The voltage of the power supplied from the DC power supply 81 is smoothed by the capacitor module 20. Each of the semiconductor module 10a, the semiconductor module 10b, and the semiconductor module 10c is connected in parallel with the capacitor module 20. Each of the semiconductor module 10a, the semiconductor module 10b, and the semiconductor module 10c includes a switching element Tu and a switching element Td. Each of the semiconductor module 10a, the semiconductor module 10b, and the semiconductor module 10c converts DC power into AC power in accordance with a control signal, and supplies the AC power to the motor 82.

Each of the semiconductor module 10a, the semiconductor module 10b, the semiconductor module 10c, the capacitor module 20, and the cooling module 30 included in the power converter 1 will be described in detail.

[Semiconductor Module 10]

The semiconductor module 10a, the semiconductor module 10b, and the semiconductor module 10c included in the power converter 1 will be described. When it is not necessary to distinguish the semiconductor module 10a, the semiconductor module 10b, and the semiconductor module 10c from each other, they may be collectively referred to as a semiconductor module 10. Here, each of the semiconductor module 10a, the semiconductor module 10b, and the semiconductor module 10c will be described using the semiconductor module 10.

Figure 5:
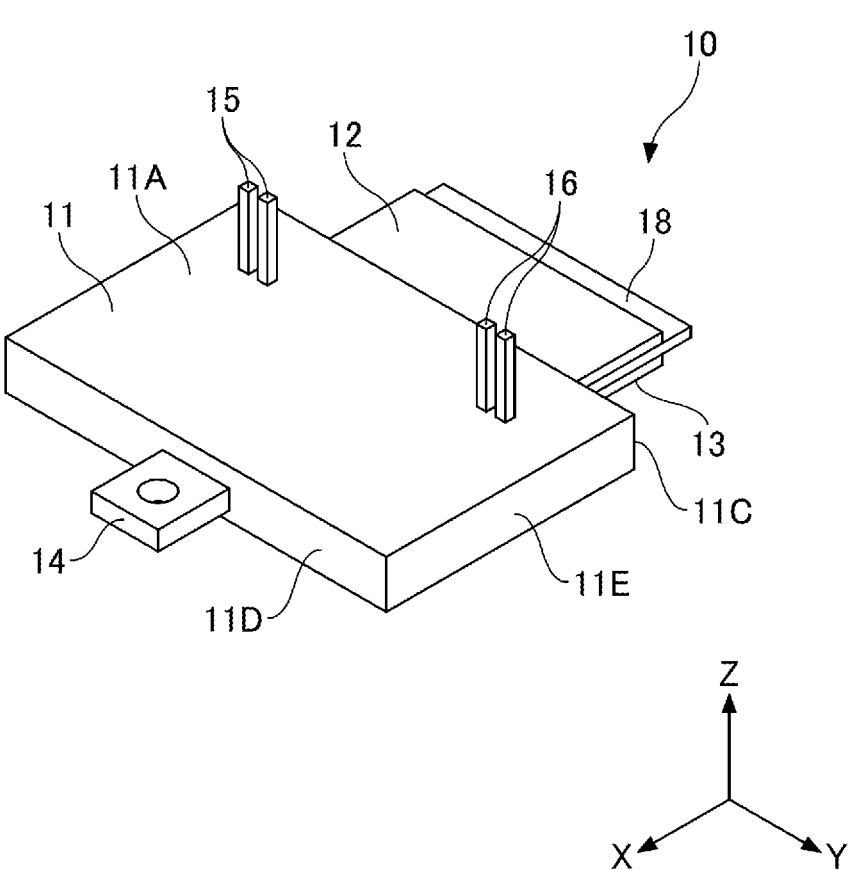
FIG. 5 is a perspective view of a semiconductor module included in the power converter according to the present embodiment.
Figure 6:
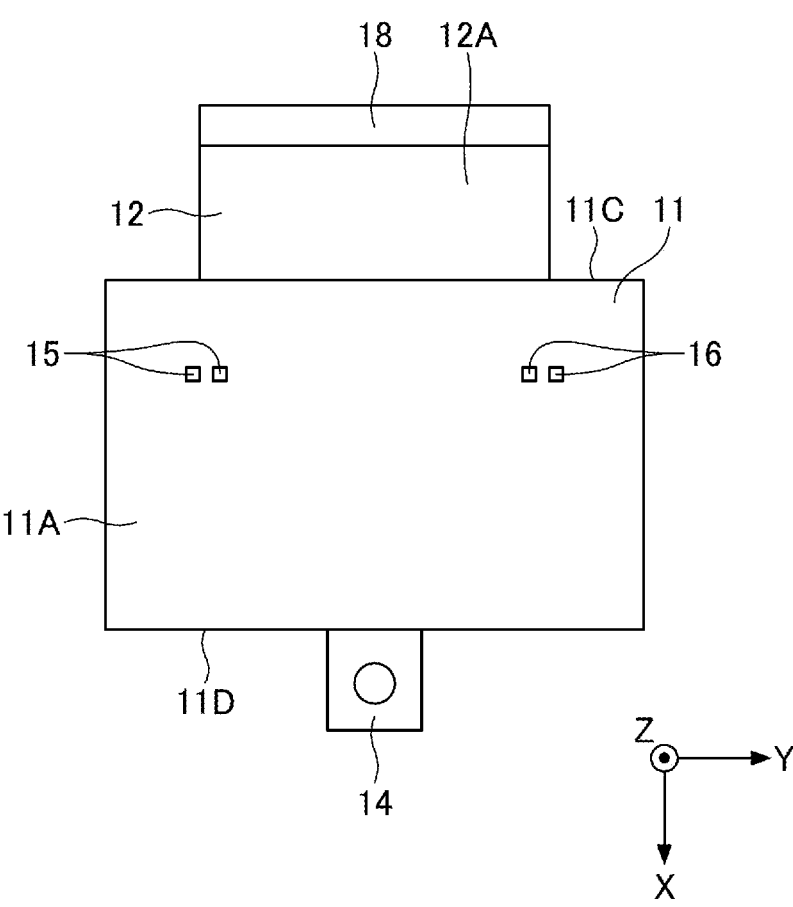
FIG. 6 is a top view of the semiconductor module included in the power converter according to the present embodiment.
Figure 7:
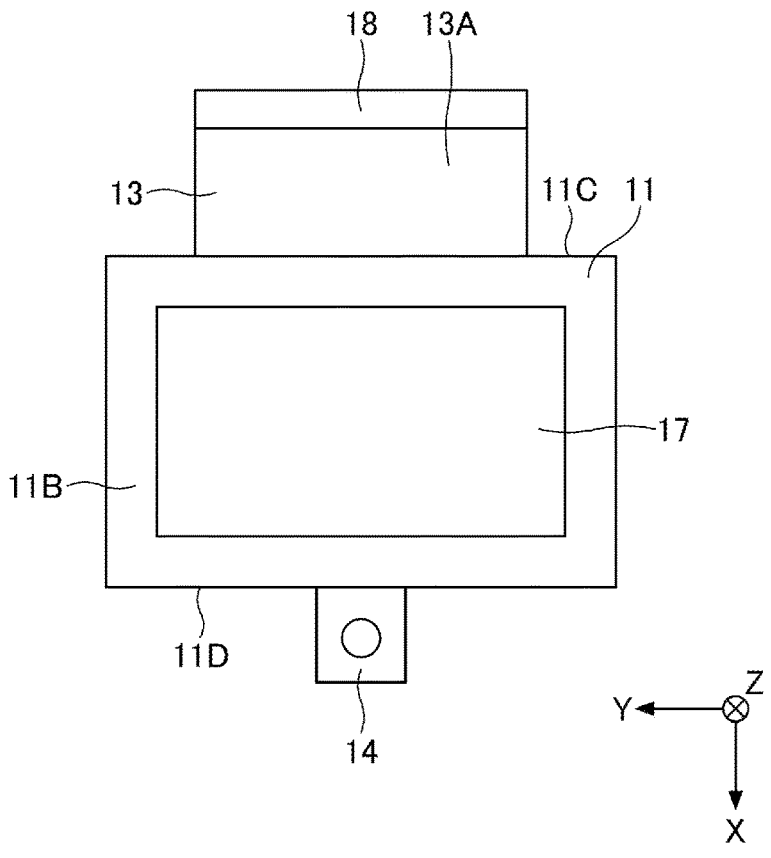
FIG. 7 is a bottom elevational view of the semiconductor module included in the power converter according to the present embodiment.
Figure 8:
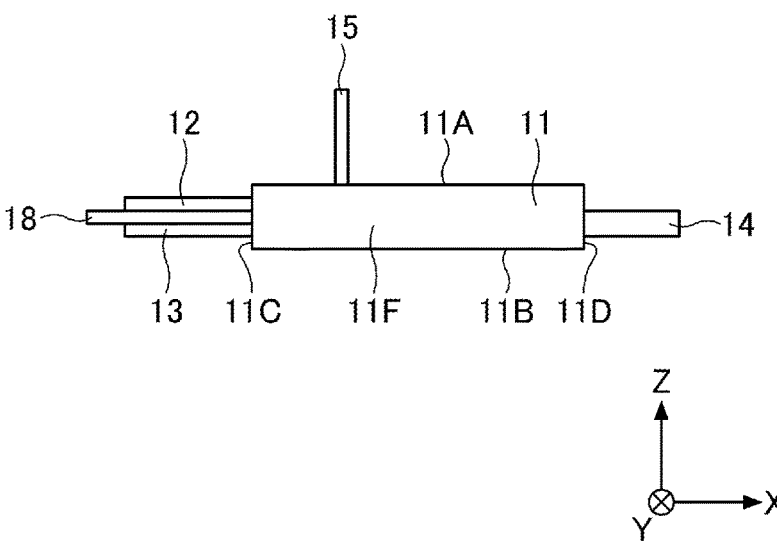
FIG. 8 is a side elevational view of the semiconductor module included in the power converter according to the present embodiment.

FIG. 5 is a perspective view of the semiconductor module 10 included in the power converter 1 which is the example of the power converter according to the present embodiment. FIG. 6 is a top view of the semiconductor module 10 included in the power converter 1 which is the example of the power converter according to the present embodiment. FIG. 7 is a bottom elevational view of the semiconductor module 10 included in the power converter 1 which is the example of the power converter according to the present embodiment. FIG. 8 is a side elevational view of the semiconductor module 10 included in the power converter 1 which is the example of the power converter according to the present embodiment.

The semiconductor module 10 is what is known as a 2-in-1 semiconductor module in which two switching elements constituting upper and lower arms for one phase are packaged. The semiconductor module 10 is also what is known as a single-side cooling type semiconductor module. The semiconductor module 10 includes the two switching elements therein. The switching elements included in the semiconductor module 10 correspond to the switching element Tu and the switching element Td in FIG. 4.

Each switching element included in the semiconductor module 10 is, for example, a power transistor. More specifically, the switching element included in the semiconductor module 10 is, for example, an insulated gate bipolar transistor (IGBT) or a field-effect transistor (FET). The switching element included in the semiconductor module 10 may also be a power metal oxide semiconductor field effect transistor (MOSFET), a free wheeling diode (FWD), or the like. Further, the switching element included in the semiconductor module 10 may be a reverse blocking-insulated gate bipolar transistor (RB-IGBT) in which the above-described IGBT or FWD is formed into one chip. Furthermore, the switching element included in the semiconductor module 10 may be a reverse conducting-insulated gate bipolar transistor (RC-IGBT) in which the above-described IGBT or FWD is formed into one chip.

The semiconductor module 10 includes a package portion 11 having a substantially rectangular parallelepiped outer shape. The package portion 11 includes the two switching elements. The package portion 11 is formed of resin, for example, an epoxy resin, and has an upper surface 11A and a lower surface 11B on the upper side and the lower side thereof, respectively. Each of the upper surface 11A and the lower surface 11B is a surface extending in parallel along the XY plane. The package portion 11 also has a side surface 11C and a side surface 11D on the rear side and the front side thereof, respectively. Each of the side surface 11C and the side surface 11D is a surface extending in parallel along the YZ plane. Further, the package portion 11 has a side surface 11E and a side surface 11F on the right side and the left side. Each of the side surface 11E and the side surface 11F is a surface extending in parallel along the ZX plane.

The semiconductor module 10 includes a DC terminal 12 and a DC terminal 13 protruding from the side surface 11C in the X-axis direction in a direction opposite to the X-axis. The semiconductor module 10 also includes an AC terminal 14 protruding from the side surface 11D in the X-axis direction in the same direction as the X-axis. The semiconductor module 10 further includes a control terminal 15 and a control terminal 16 protruding from the upper surface 11A in the Z-axis direction in the same direction as the Z-axis. Furthermore, the semiconductor module 10 includes a heat dissipation plate 17 on the lower surface 11B.

(DC Terminal 12 and DC Terminal 13)

Each of the DC terminal 12 and the DC terminal 13 is connected to the capacitor module 20. DC power supplied from an external power supply, i.e., the DC power supply 81, is supplied to each of the DC terminal 12 and the DC terminal 13 via the capacitor module 20. One of the DC terminal 12 and the DC terminal 13 is connected to a positive terminal of the DC power supply, and the other is connected to a negative terminal of the DC power supply.

Each of the DC terminal 12 and the DC terminal 13 has a plate shape extending in the X-axis direction and the Y-axis direction. The DC terminal 12 has the same shape as that of the DC terminal 13 in a top view. Each of the DC terminal 12 and the DC terminal 13 is formed of a conductive material, for example, a metal.

The semiconductor module 10 includes an insulating member 18 formed of an insulating material between the DC terminal 12 and the DC terminal 13. The insulating member 18 has a plate shape extending in the X-axis direction and the Y-axis direction. The insulating member 18 has the same length in the Y-axis direction as each of the DC terminal 12 and the DC terminal 13 in a top view. On the other hand, the insulating member 18 is longer on the rear side (−X side) in a top view than each of the DC terminal 12 and the DC terminal 13 in the X-axis direction.

The DC terminal 12 is provided over the DC terminal 13 so as to interpose the insulating member 18 therebetween. In other words, the DC terminal 12 and the DC terminal 13 are stacked in the Z-axis direction (up-and-down direction) via the insulating member 18. By overlapping the DC terminal 12 and the DC terminal 13 in the up-and-down direction, the impedance between the conductors can be reduced.

Further, since each of the DC terminal 12 and the DC terminal 13 protrudes substantially perpendicularly from the side surface 11C, the length of the terminals can be made as short as possible. The wiring impedance can be reduced by shortening the terminal length.

(AC Terminal 14)

The AC terminal 14 is connected to an external load such as a motor. AC power is supplied from the AC terminal 14 to the external load.

The AC terminal 14 extends in the X-axis direction and the Y-axis direction, and has a plate shape elongated in the X-axis direction. The AC terminal 14 has a through hole to connect wiring with a fastening member such as a screw. The AC terminal 14 is formed of a conductive material.

(Control Terminal 15 and Control Terminal 16)

Each of the control terminal 15 and the control terminal 16 receives a signal for controlling a switching element incorporated in the semiconductor module 10 from an external control circuit. The switching element incorporated in the semiconductor module 10 operates based on a control signal input from either the control terminal 15 or the control terminal 16. The semiconductor module 10 converts DC power into AC power by the switching element operating based on the control signal input from either the control terminal 15 or the control terminal 16.

Each of the control terminal 15 and the control terminal 16 has a rod shape extending in the Z-axis direction. The control terminal 15 and the control terminal 16 are formed of a conductive material.

(Heat Dissipation Plate 17)

The heat dissipation plate 17 dissipates heat generated in the switching elements incorporated in the semiconductor module 10. The heat dissipation plate 17 is thermally connected to the switching elements incorporated in the semiconductor module 10 so as to efficiently transfer heat from the switching elements.

The heat dissipation plate 17 has a plate shape extending in the X-axis direction and the Y-axis direction. The heat dissipation plate 17 is provided so as to be exposed to the lower side (−Z side) from the package portion 11. The heat dissipation plate 17 is formed of a member having high thermal conductivity, for example, metal.

[Capacitor Module 20]

The capacitor module 20 is connected between the positive terminal and the negative terminal of the external DC power supply 81. The capacitor module 20 functions as a capacitive element.

Figure 9:
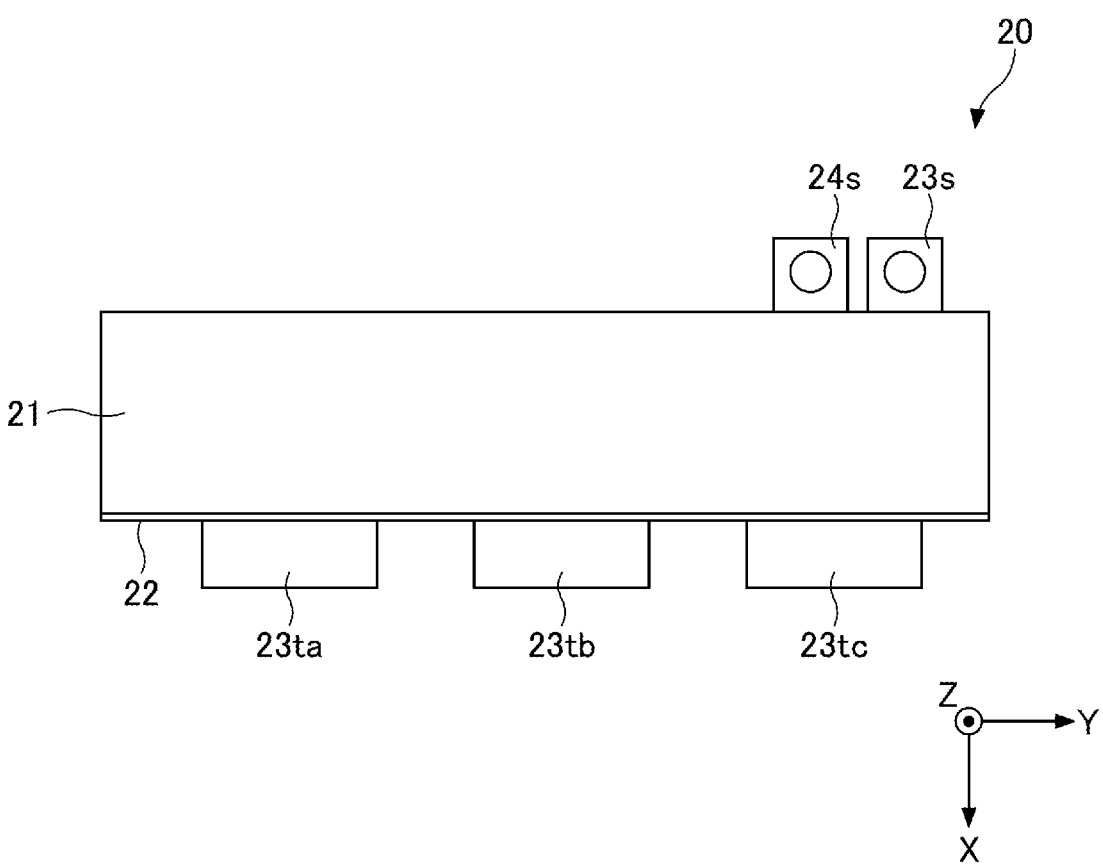
FIG. 9 is a top view of a capacitor module included in the power converter according to the present embodiment.
Figure 10:
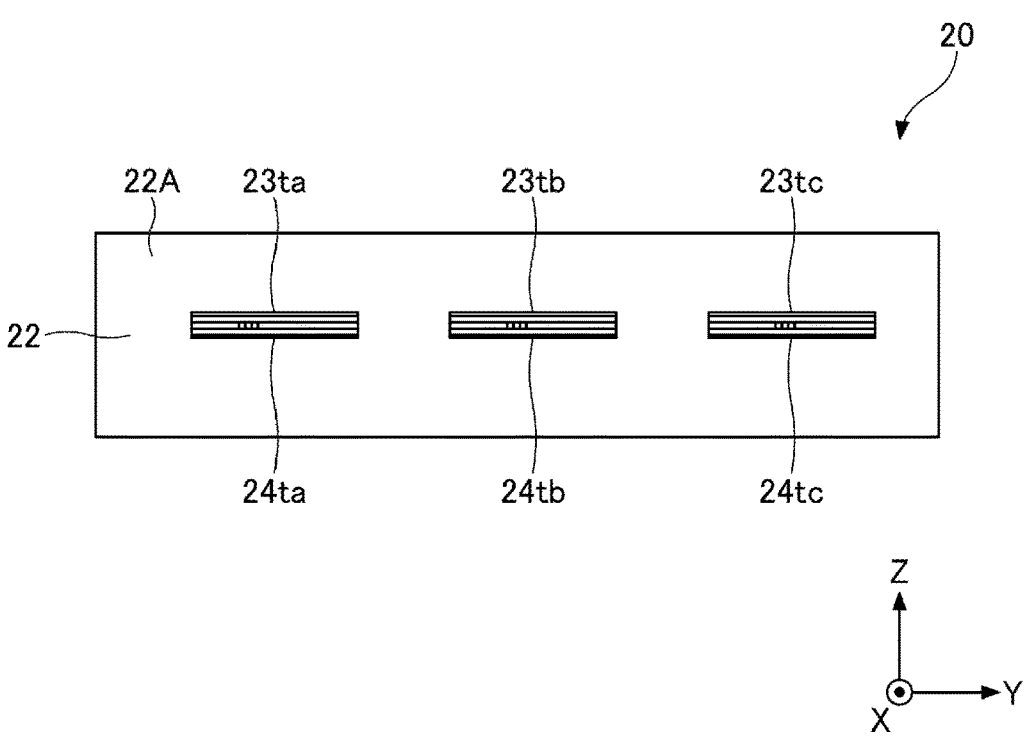
FIG. 10 is a front elevational view of the capacitor module included in the power converter according to the present embodiment.
Figure 11:
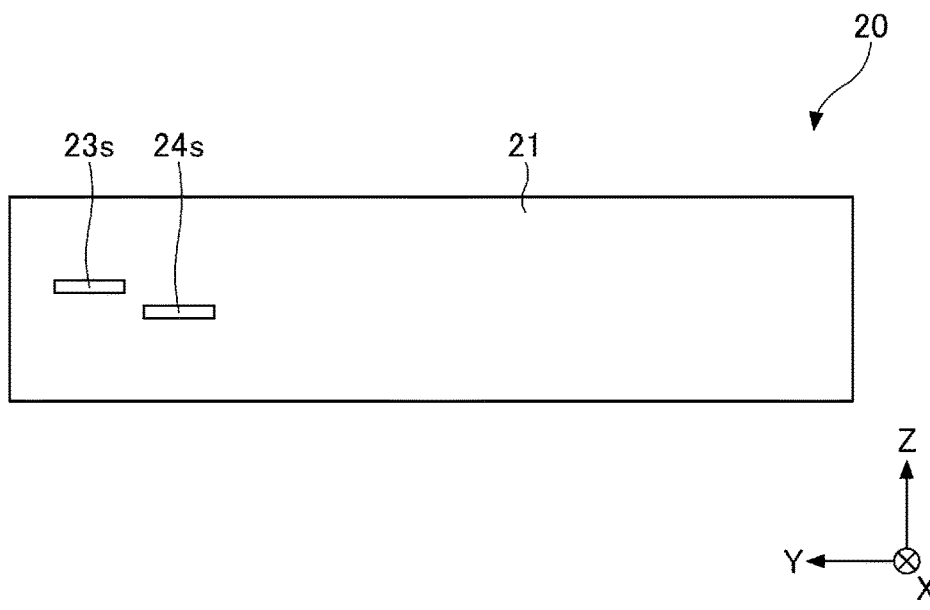
FIG. 11 is a rear elevational view of the capacitor module included in the power converter according to the present embodiment.
Figure 12:
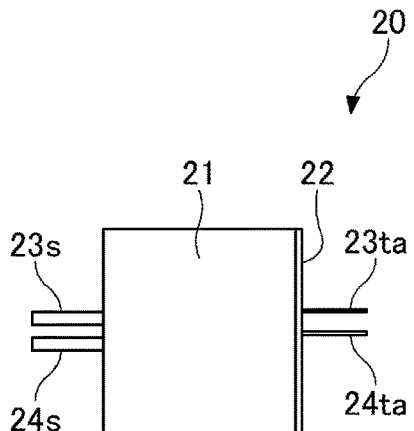
FIG. 12 is a side elevational view of the capacitor module included in the power converter according to the present embodiment.

The capacitor module 20 will be described. FIG. 9 is a top view of the capacitor module 20 included in the power converter 1 which is the example of the power converter according to the present embodiment. FIG. 10 is a front elevational view of the capacitor module 20 included in the power converter 1 which is the example of the power converter according to the present embodiment. FIG. 11 is a rear elevational view of the capacitor module 20 included in the power converter 1 which is the example of the power converter according to the present embodiment. FIG. 12 is a side elevational view of the capacitor module 20 included in the power converter 1 which is the example of the power converter according to the present embodiment.

The capacitor module 20 includes a case 21 and a sheet 22. The capacitor module 20 includes a power supply terminal 23s and a power supply terminal 24s which are provided to protrude from a side surface on the rear side (−X side) of the case 21. One of the power supply terminal 23s and the power supply terminal 24s is connected to a positive terminal of the DC power supply, and the other is connected to the negative terminal of the DC power supply. The capacitor module 20 also includes a capacitor terminal 23ta, a capacitor terminal 24ta, a capacitor terminal 23tb, a capacitor terminal 24tb, a capacitor terminal 23tc, and a capacitor terminal 24tc protruding from the front side (+X side) of the sheet 22.

The capacitor terminal 23ta and the capacitor terminal 24ta are connected to the DC terminal 12 and the DC terminal 13 of the semiconductor module 10a, respectively. The capacitor terminal 23tb and the capacitor terminal 24tb are connected to the DC terminal 12 and the DC terminal 13 of the semiconductor module 10b, respectively. The capacitor terminal 23tc and the capacitor terminal 24tc are connected to the DC terminal 12 and the DC terminal 13 of the semiconductor module 10c, respectively.

(Case 21)

The case 21 includes a bus bar 23 and a bus bar 24, and capacitor elements 25, which will be described later. The case 21 protects the bus bar 23, the bus bar 24, and the capacitor elements 25 provided therein. The case 21 has a box shape whose front side (+X side) is open. The case 21 is formed of an insulating member such as an insulating resin.

(Sheet 22)

The sheet 22 is provided so as to close and cover the opening on the front side (+X side) of the case 21. The sheet 22 also ensures electrical insulation between members inside the case 21, specifically, the bus bar 23 and the bus bar 24, and the cooling module 30. The bus bar 23 and the bus bar 24 are covered with the sheet 22.

The sheet 22 has a plate shape extending in the Y-axis direction and the Z-axis direction. The sheet 22 is formed of an insulating member having high thermal conductivity. The front surface of the sheet 22 serves as a heat transfer surface 22A.

The insulating member used for the sheet 22 preferably has a dielectric breakdown voltage of equal to or greater than 1 kilovolt (kV) and a thermal conductivity of equal to or greater than 0.8 watts per meter per kelvin (W/(m·K)). The sheet 22 may be, for example, a high-thermal-conductivity type heat dissipating gel sheet or a glass-fiber-reinforced heat conductive sheet. The sheet 22 may also be a sheet formed by curing a liquid gap-filling material. The sheet 22 is preferably formed of a flexible material that is capable of adhering to a contacting surface to facilitate heat transfer to and from the contacting member.

Figure 13:
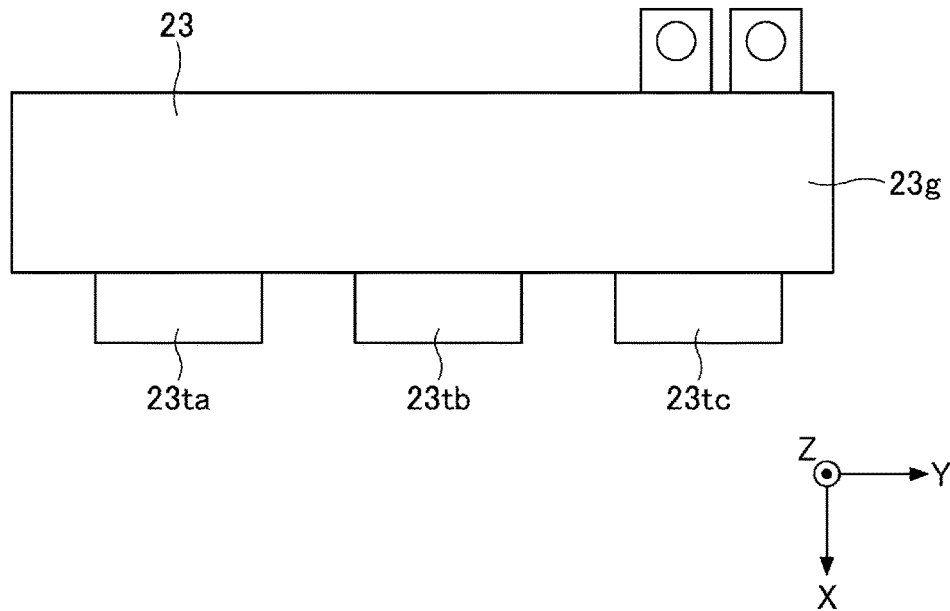
FIG. 13 is a top view illustrating an internal configuration of the capacitor module included in the power converter according to the present embodiment.
Figure 14:
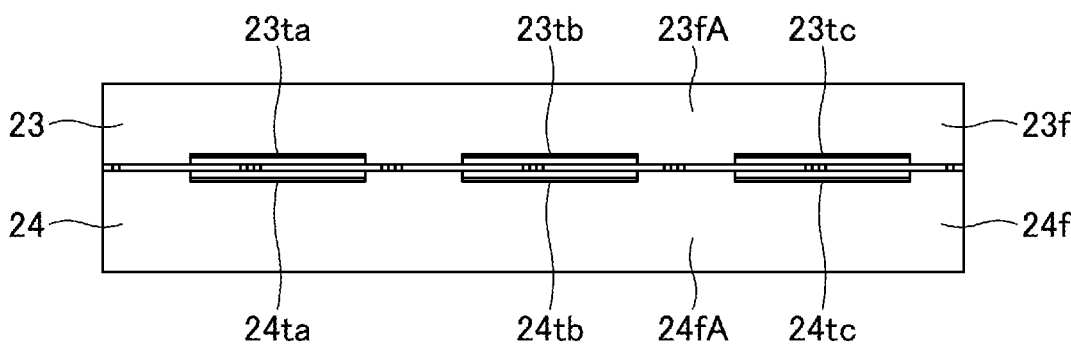
FIG. 14 is a front elevational view illustrating the internal configuration of the capacitor module included in the power converter according to the present embodiment.
Figure 14:
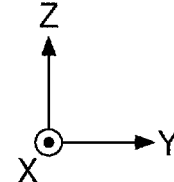
Figure 15:
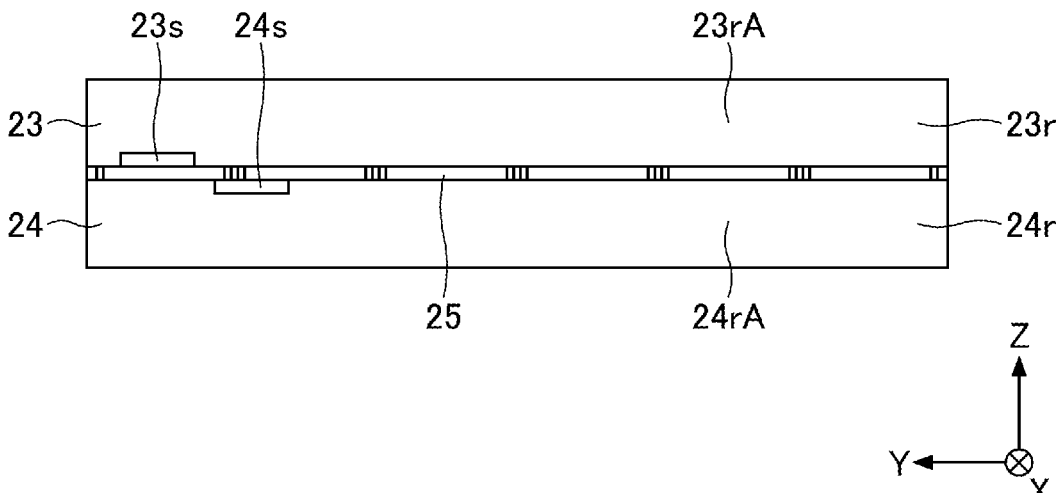
FIG. 15 is a rear elevational view illustrating the internal configuration of the capacitor module included in the power converter according to the present embodiment.
Figure 16:
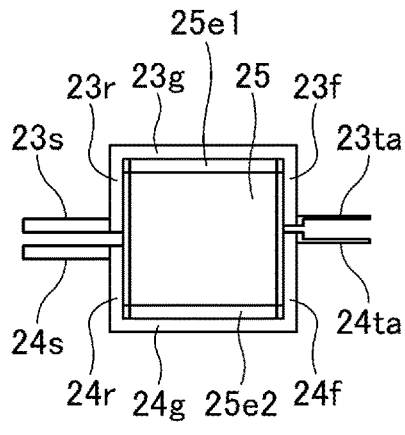
FIG. 16 is a side elevational view illustrating the internal configuration of the capacitor module included in the power converter according to the present embodiment.
Figure 16:
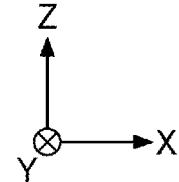
Figure 17:
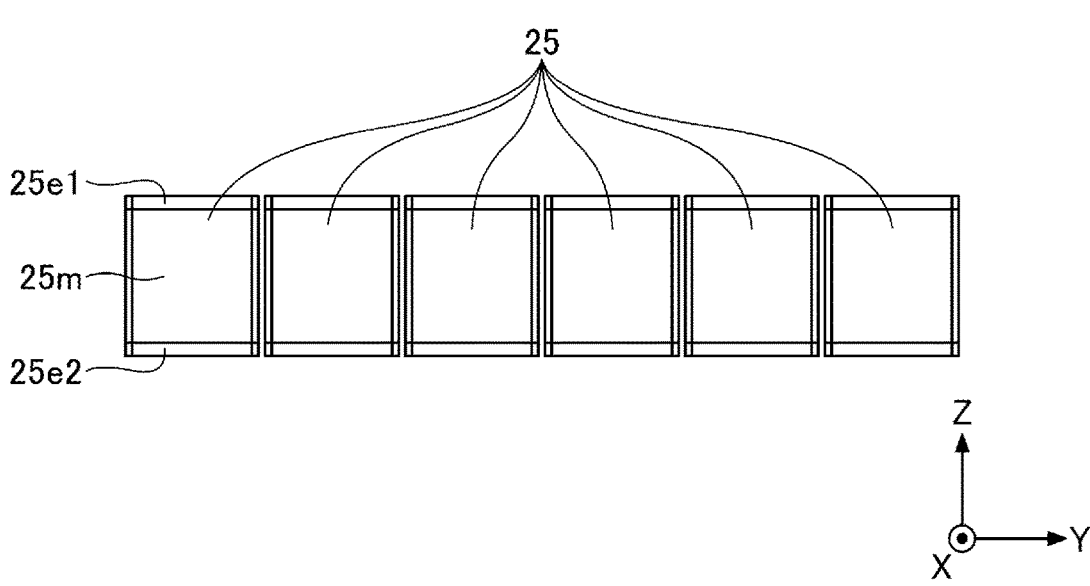
FIG. 17 is another front elevational view illustrating the internal configuration of a capacitor module included in the power converter according to the present embodiment.

An internal structure of the capacitor module 20 will now be described. FIG. 13 is a top view illustrating the internal configuration of the capacitor module 20 included in the power converter 1 which is the example of the power converter according to the present embodiment. FIG. 14 is a front elevational view illustrating the internal configuration of the capacitor module 20 included in the power converter 1 which is the example of the power converter according to the present embodiment. FIG. 15 is a rear elevational view illustrating the internal configuration of the capacitor module 20 included in the power converter 1 which is the example of the power converter according to the present embodiment. FIG. 16 is a side elevational view illustrating the internal configuration of the capacitor module 20 included in the power converter 1 which is the example of the power converter according to the present embodiment. FIG. 17 is a front elevational view illustrating the internal configuration of the capacitor module 20 included in the power converter 1 which is the example of the power converter according to the present embodiment.

Specifically, each of FIG. 13 to FIG. 16 is a diagram illustrating a state in which the case 21 and the sheet 22 are removed from the capacitor module 20 included in the power converter 1 which is the example of the power converter according to the present embodiment. FIG. 17 is a diagram illustrating a state in which the case 21, the sheet 22, the bus bar 23, and the bus bar 24 are removed from the capacitor module 20 included in the power converter 1 which is the example of the power converter according to the present embodiment.

The capacitor module 20 includes the bus bar 23, the bus bar 24, and the capacitor elements 25 inside the case 21. The capacitor elements 25 are located between the bus bar 23 and the bus bar 24.

(Bus Bar 23)

The bus bar 23 is electrically connected to electrodes 25e1 of each of the capacitor elements 25. The bus bar 23 is formed of a conductive material. The bus bar 23 includes a vertical plate portion 23f, a horizontal plate portion 23g, and another vertical plate portion 23r. The bus bar 23 is formed by, for example, bending a metal plate. Note that the processing method of the bus bar 23 is not limited to bending, and any processing method may be selected as appropriate.

The vertical plate portion 23f is provided on the front side (+ side) of the bus bar 23. The vertical plate portion 23f extends in the Y-axis direction and the Z-axis direction and has a rectangular shape in a front view. The vertical plate portion 23f extends from the front side (+X side) end portion of the horizontal plate portion 23g in the direction opposite to the Z-axis. The vertical plate portion 23f has a front surface 23fA which is a surface parallel to the YZ plane.

The vertical plate portion 23f has the capacitor terminal 23ta, the capacitor terminal 23tb, and the capacitor terminal 23tc on the front surface 23fA. Each of the capacitor terminal 23ta, the capacitor terminal 23tb, and the capacitor terminal 23tc is provided to protrude from the front surface 23fA toward the front side (+X side) in the X-axis direction. The capacitor terminal 23ta, the capacitor terminal 23tb, and the capacitor terminal 23tc are arranged side by side at intervals in the Y-axis direction.

The capacitor terminal 23ta is connected to the DC terminal 12 of the semiconductor module 10a by pressure welding or welding. The capacitor terminal 23ta is connected to the DC terminal 12 of the semiconductor module 10a from the upper side (+Z side). The capacitor terminal 23ta has, on the front side (+X side), a step on which the DC terminal 12 of the semiconductor module 10a is disposed. Since the capacitor terminal 23ta has the step, the thicknesses in the Z-axis direction when the DC terminal 12 and the capacitor terminal 23ta are stacked can be reduced. The same applies to the capacitor terminal 23tb and the capacitor terminal 23tc.

The front side 23fA is connected to the cooling module 30 via the sheet 22. When the front surface 23fA is connected to the cooling module 30, the vertical plate portion 23f is cooled. By cooling the vertical plate portion 23f, the bus bar 23 and the capacitor element 25 connected to the bus bar 23 are cooled.

The horizontal plate portion 23g is provided on the upper side (+Z side) of the bus bar 23. The horizontal plate portion 23g extends in the X-axis direction and the Y-axis direction, and has a rectangular shape in a top view. The electrode 25e1 of the capacitor element 25 is connected to the lower surface (−Z side) of the horizontal plate portion 23g. The horizontal plate portion 23g and the electrode 25e1 of the capacitor element 25 are connected by, for example, soldering or welding. Since the horizontal plate portion 23g has a plate shape, the contact area between the horizontal plate portion 23g and the electrode 25e1 of the capacitor element 25 can be increased to reduce the contact resistance between the horizontal plate portion 23g and the electrode 25e1 of the capacitor element 25. Furthermore, by increasing the contact area between the horizontal plate portion 23g and the electrode 25e1 of the capacitor element 25, heat can be efficiently transferred from the capacitor element 25 to the cooling module 30.

The vertical plate portion 23r is provided on the rear side (−X side) of the bus bar 23. The vertical plate portion 23r extends in the Y-axis direction and the Z-axis direction, and has a rectangular shape in a rear view. The vertical plate portion 23r extends from the rear side (−X side) end portion of the horizontal plate portion 23g in the direction opposite to the Z-axis. The vertical plate portion 23r has a rear surface 23rA which is a surface parallel to the YZ plane.

The vertical plate portion 23r has the power supply terminal 23s on the rear surface 23rA. The power supply terminal 23s is provided to protrude from the rear surface 23rA to the rear side (−X side) in the X-axis direction. The power supply terminal 23s is provided so as to be shifted from the power supply terminal 24s in the left-right direction (Y-axis direction).

In the bus bar 23, each of the vertical plate portion 23f, the horizontal plate portion 23g, and the vertical plate portion 23r has a plate shape, and thus it is possible to increase a cross-sectional area of a portion through which electricity flows. By increasing the cross-sectional area of the portion of the bus bar 23 through which electricity flows, the internal wiring resistance of the bus bar 23 can be reduced. The bus bar 23 can reduce the Joule heat generated therein by reducing the internal wiring resistance.

(Bus Bar 24)

The bus bar 24 is electrically connected to electrodes 25e2 of each of the capacitor elements 25. The bus bar 24 is formed of a conductive material. The bus bar 24 includes a vertical plate portion 24f, a horizontal plate portion 24g, and another vertical plate portion 24r. The bus bar 24 is formed by, for example, bending a metal plate. The processing method of the bus bar 24 is not limited to bending, and any processing method may be selected as appropriate.

The vertical plate portion 24f is provided on the front side (+ side) of the bus bar 24. The vertical plate portion 24f extends in the Y-axis direction and the Z-axis direction and has a rectangular shape in a front view. The vertical plate portion 24f extends from the front side (+X side) end portion of the horizontal plate portion 24g in the same direction as the Z-axis. The vertical plate portion 24f has a front surface 24fA which is a surface parallel to the YZ plane.

The vertical plate portion 24f has a capacitor terminal 24ta, a capacitor terminal 24tb, and a capacitor terminal 24tc on the front surface 24fA. Each of the capacitor terminal 24ta, the capacitor terminal 24tb, and the capacitor terminal 24tc is provided to protrude from the front surface 24fA toward the front side (+X side) in the X-axis direction. The capacitor terminal 24ta, the capacitor terminal 24tb, and the capacitor terminal 24tc are arranged side by side at intervals in the Y-axis direction.

The capacitor terminal 24ta is connected to the DC terminal 13 of the semiconductor module 10a by pressure welding or welding. The capacitor terminal 24ta is connected to the DC terminal 13 of the semiconductor module 10a from the lower side (+Z side). The capacitor terminal 24ta has, on the front side (+X side), a step on which the DC terminal 13 of the semiconductor module 10a is disposed. Since the capacitor terminal 24ta has the step, the thicknesses in the Z-axis direction when the DC terminal 13 and the capacitor terminal 24ta are stacked can be reduced. The same applies to the capacitor terminal 24tb and the capacitor terminal 24tc.

The front surface 24fA is connected to the cooling module 30 via the sheet 22. When the front surface 24fA is connected to the cooling module 30, the vertical plate portion 24f is cooled. By cooling the vertical plate portion 24f, the bus bar 24 and the capacitor element 25 connected to the bus bar 24 are cooled.

The horizontal plate portion 24g is provided on the lower side (−Z side) of the bus bar 24. The horizontal plate portion 24g extends in the X-axis direction and the Y-axis direction, and has a rectangular shape in a bottom view. The electrode 25e2 of the capacitor element 25 is connected to the upper surface (+Z side) of the horizontal plate portion 24g. The horizontal plate portion 24g and the electrode 25e2 of the capacitor element 25 are connected by, for example, soldering or welding. Since the horizontal plate portion 24g has a plate shape, the contact area between the horizontal plate portion 24g and the electrode 25e2 of the capacitor element 25 can be increased to reduce the contact resistance between the horizontal plate portion 24g and the electrode 25e2 of the capacitor element 25. Furthermore, by increasing the contact area between the horizontal plate portion 24g and the electrode 25e2 of the capacitor element 25, heat can be efficiently transferred from the capacitor element 25 to the cooling module 30.

The vertical plate portion 24r is provided on the rear side (−X side) of the bus bar 24. The vertical plate portion 24r extends in the Y-axis direction and the Z-axis direction, and has a rectangular shape in a rear view. The vertical plate portion 24r extends from the rear side (−X side) end portion of the horizontal plate portion 24g in the same direction as the Z-axis. The vertical plate portion 24r has a rear surface 24rA which is a surface parallel to the YZ plane.

The vertical plate portion 24r has the power supply terminal 24s on the rear surface 24rA. The power supply terminal 24s is provided to protrude from the rear surface 24rA to the rear side (−X side) in the X-axis direction. The power supply terminal 24s is provided so as to be shifted from the power supply terminal 23s in the left-right direction (Y-axis direction).

In the bus bar 24, each of the vertical plate portion 24f, the horizontal plate portion 24g, and the vertical plate portion 24r has a plate shape, and thus it is possible to increase a cross-sectional area of a portion through which electricity flows. By increasing the cross-sectional area of the portion of the bus bar 24 through which electricity flows, the internal wiring resistance of the bus bar 24 can be reduced. The bus bar 24 can reduce the Joule heat generated therein by reducing the internal wiring resistance.

(Capacitor Element 25)

The capacitor module 20 includes the capacitor elements 25. Specifically, the capacitor module 20 includes six of the capacitor element 25. The number of capacitor elements 25 is not limited to six, and may be one, or two or more.

The capacitor element 25 is, for example, a film capacitor. The capacitor element 25 includes a capacitor body portion 25m, the electrode 25e1, and electrode 25e2.

The capacitor body portion 25m includes a dielectric or the like for storing charge. For example, when the capacitor element 25 is a film capacitor, a film serving as a dielectric and electrodes are laminated or wound inside the capacitor body portion 25m. The electrode 25e1 and the electrode 25e2 are electrodes for connecting from the capacitor body portion 25m to the outside.

[Cooling Module 30]

The cooling module 30 will now be described. The cooling module 30 cools the semiconductor module 10a, the semiconductor module 10b, the semiconductor module 10c, and the capacitor module 20.

Figure 18:
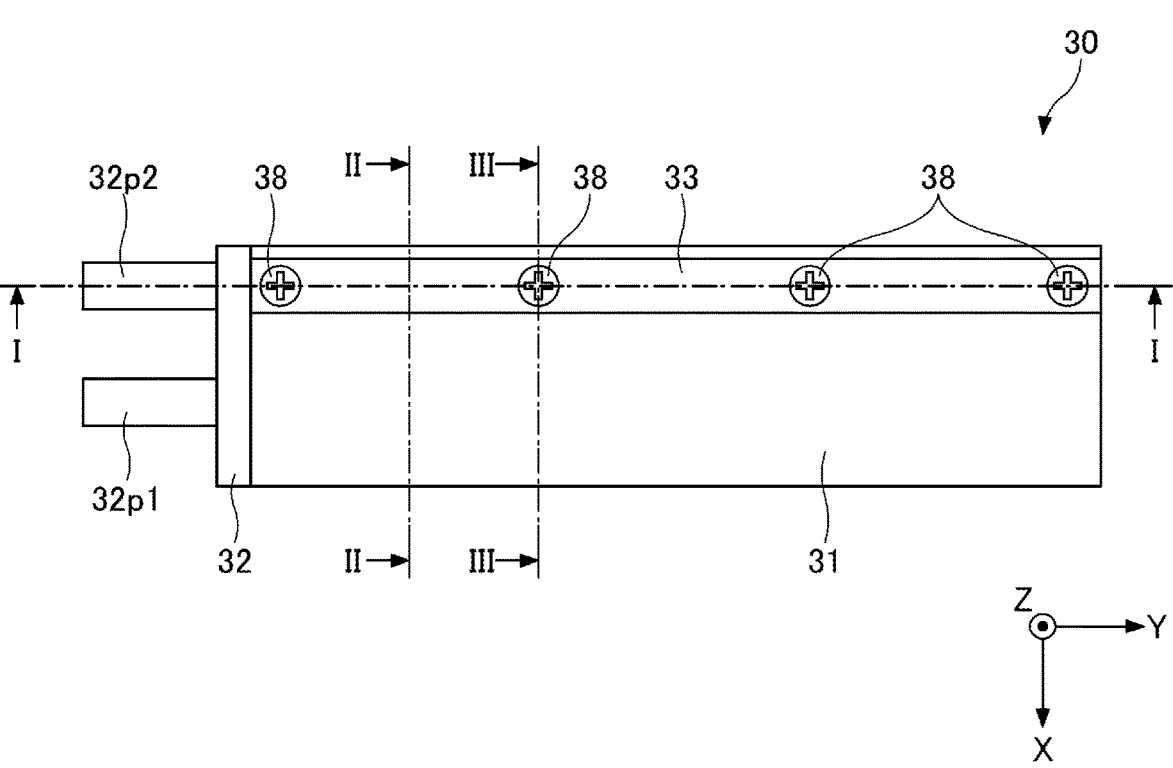
FIG. 18 is a top view of a cooling module included in the power converter according to the present embodiment.
Figure 19:
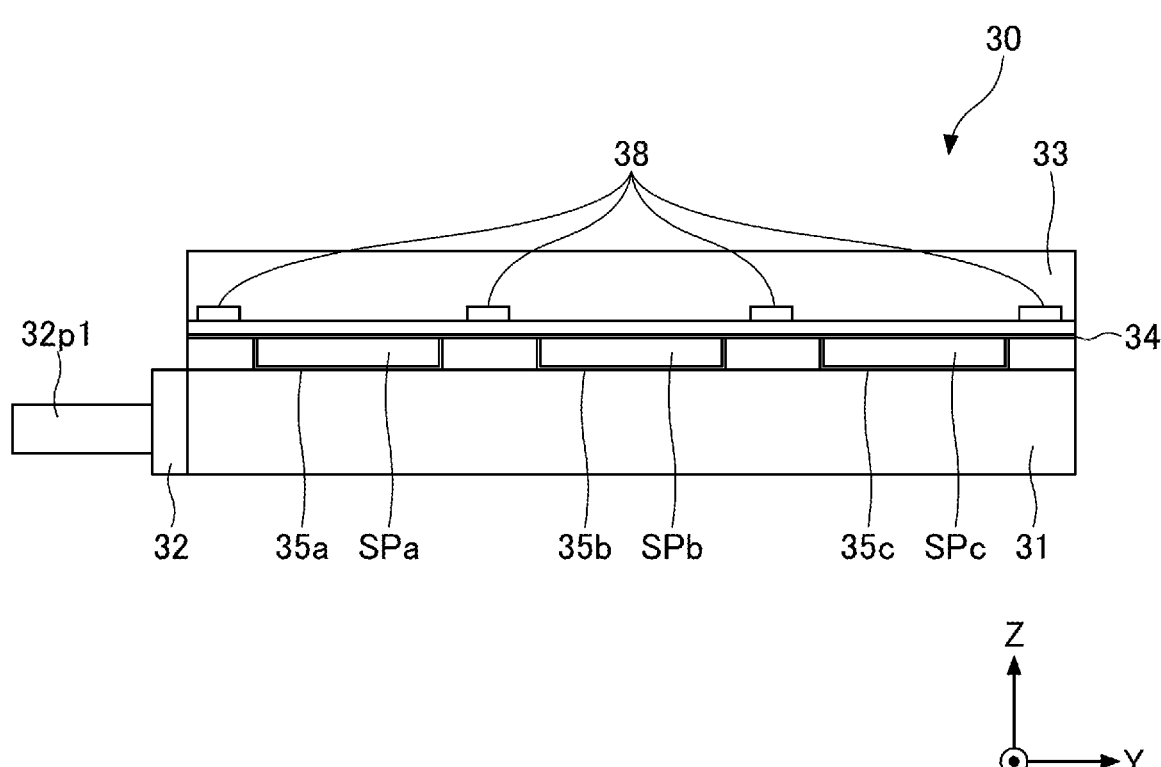
FIG. 19 is a front elevational view of the cooling module included in the power converter according to the present embodiment.
Figure 20:
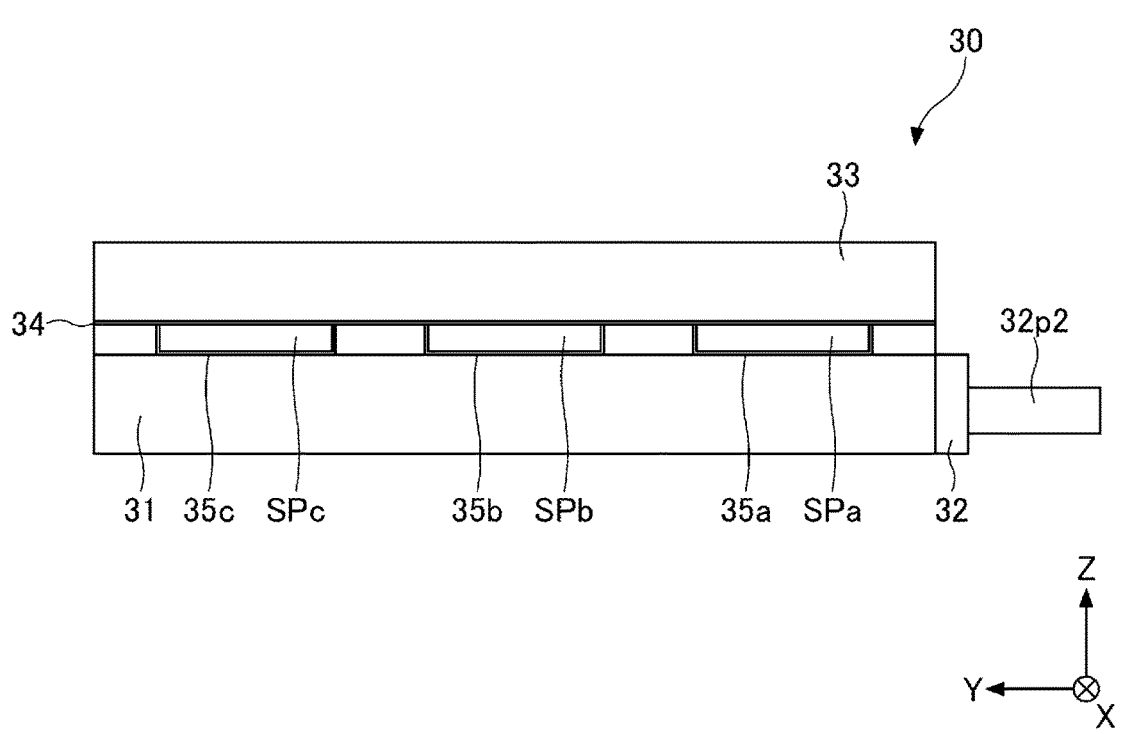
FIG. 20 is a rear elevational view of the cooling module included in the power converter according to the present embodiment.
Figure 21:
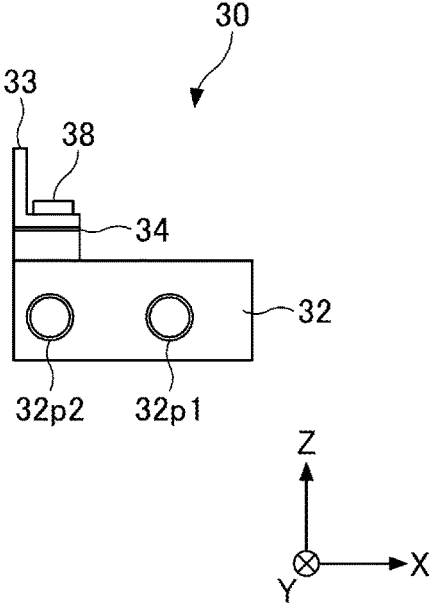
FIG. 21 is a side elevational view of the cooling module included in the power converter according to the present embodiment.

FIG. 18 is a top view of the cooling module 30 included in the power converter 1 which is the example of the power converter according to the present embodiment. FIG. 19 is a front elevational view of the cooling module 30 included in the power converter 1 which is the example of the power converter according to the present embodiment. FIG. 20 is a rear elevational view of the cooling module 30 included in the power converter 1 which is the example of the power converter according to the present embodiment. FIG. 21 is a side elevational view of the cooling module 30 included in the power converter 1 which is the example of the power converter according to the present embodiment.

Figure 22:
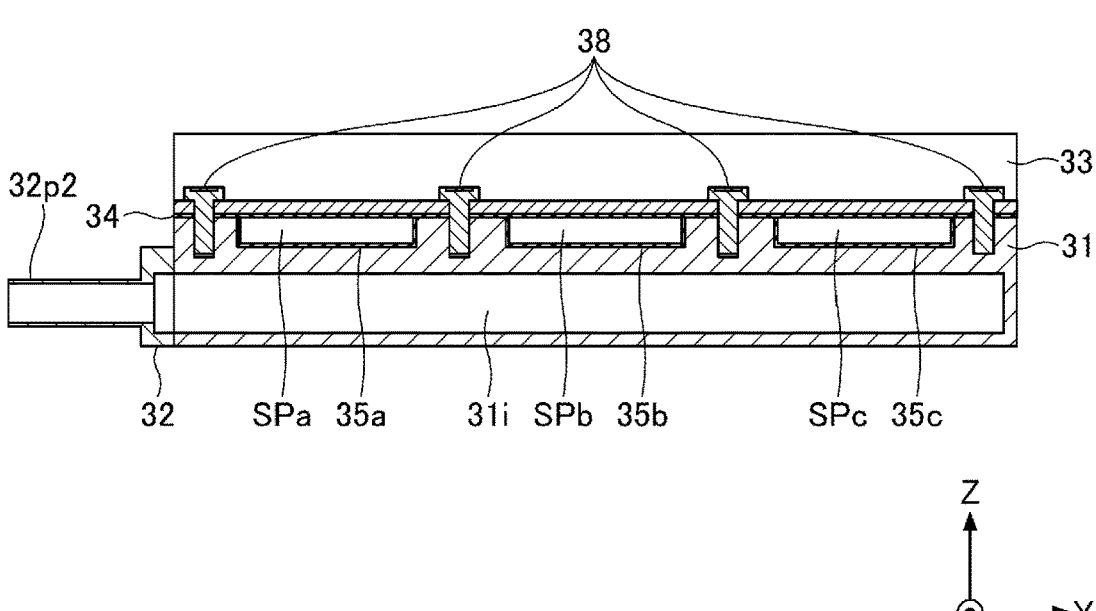
FIG. 22 is a cross-sectional view of the cooling module included in the power converter according to the present embodiment.
Figure 23:
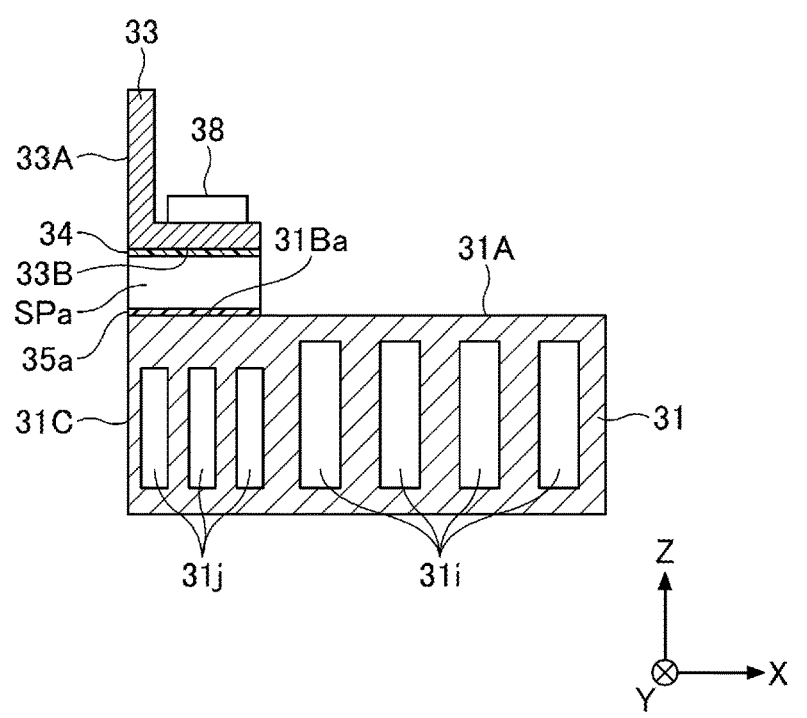
FIG. 23 is another cross-sectional view of the cooling module included in the power converter according to the present embodiment.
Figure 24:
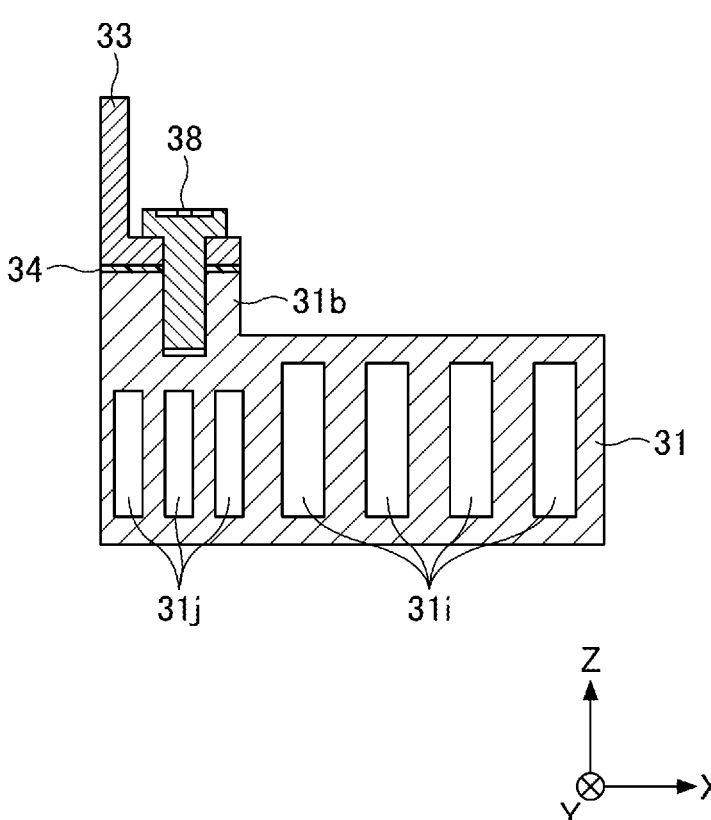
FIG. 24 is yet another cross-sectional view of the cooling module included in the power converter according to the present embodiment.

Each of FIG. 22, FIG. 23, and FIG. 24 is a cross-sectional view of the cooling module 30 included in the power converter 1 which is the example of the power converter according to the present embodiment. Specifically, FIG. 22 is the cross-sectional view taken along line I-I in FIG. 18. FIG. 23 is the cross-sectional view taken along line II-II in FIG. 18. FIG. 24 is the cross-sectional view taken along line III-III in FIG. 18.

The cooling module 30 includes a lower cooling part 31, a refrigerant inlet/outlet portion 32, and an upper cooling part 33. The cooling module 30 has a space SPa, a space SPb, and a space SPc between the lower cooling part 31 and the upper cooling part 33. The DC terminals of the semiconductor module 10a, the semiconductor module 10b, and the semiconductor module 10c and the capacitor terminals of the capacitor module 20 are disposed in the respective spaces SPa, SPb, and SPc.

(Lower Cooling Part 31)

The lower cooling part 31 cools the semiconductor module 10a, the semiconductor module 10b, the semiconductor module 10c, and the capacitor module 20. A refrigerant flows through the lower cooling part 31. The refrigerant inlet/outlet portion 32 is connected to the left side (−Y side) end portion of the lower cooling part 31. The refrigerant introduced into the refrigerant inlet/outlet portion 32 from the outside flows from left to right in the Y-axis direction inside the lower cooling part 31. The refrigerant then turns back at the right side (+Y side) end portion of the lower cooling part 31 and flows from right to left in the Y-axis direction inside the lower cooling part 31. The refrigerant is then discharged from the refrigerant inlet/outlet portion 32 to the outside.

Figure 25:
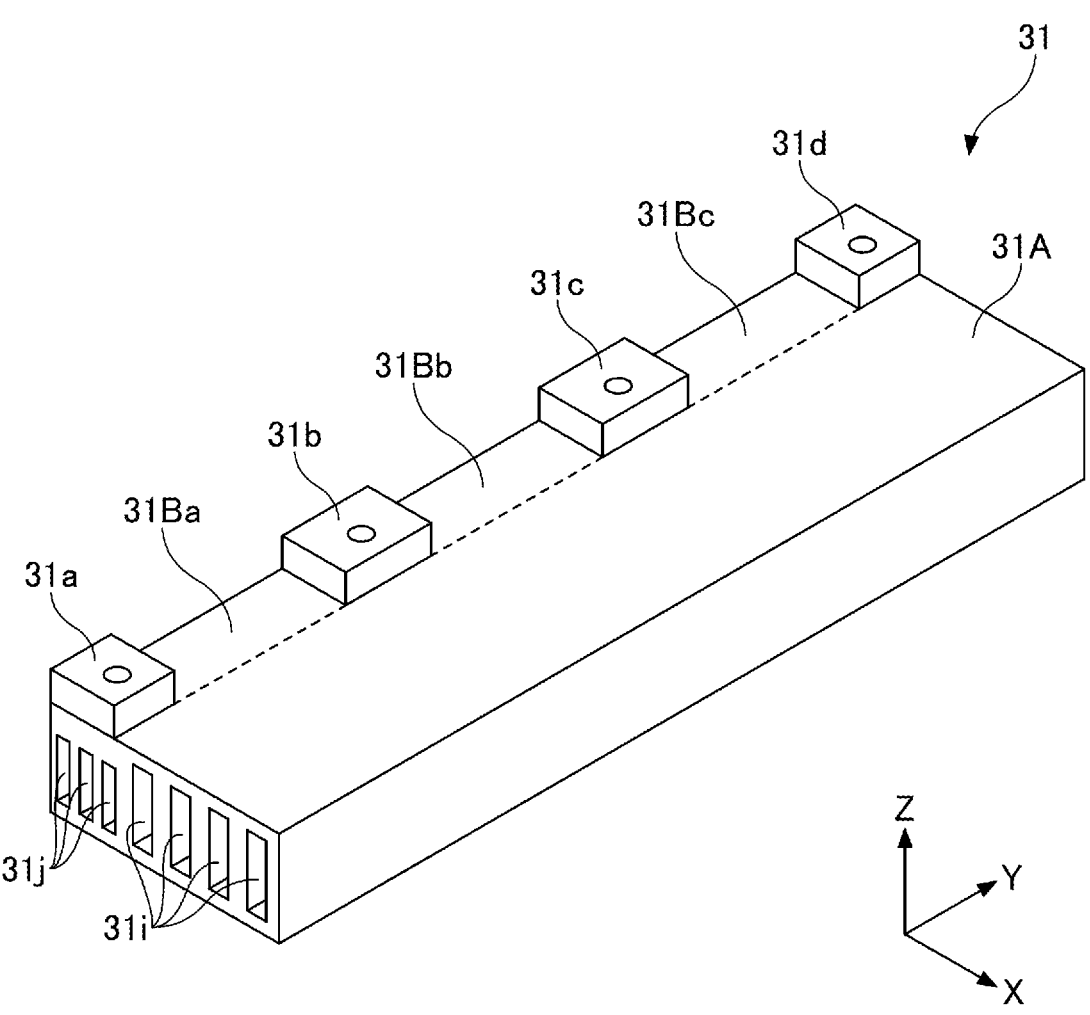
FIG. 25 is a perspective view of the cooling module included in the power converter according to the present embodiment.

FIG. 25 is a perspective view of the lower cooling part 31 in the cooling module 30 included in the power converter 1 which is the example of the power converter according to the present embodiment.

The lower cooling part 31 has, on the upper side thereof, a cooling surface 31A on which the semiconductor module 10a, the semiconductor module 10b, and the semiconductor module 10c are placed. The cooling surface 31A faces the heat dissipation plate 17 of each of the semiconductor module 10a, the semiconductor module 10b, and the semiconductor module 10c. The heat dissipation plate 17 of each of the semiconductor module 10a, the semiconductor module 10b, and the semiconductor module 10c is bonded to the cooling surface 31A of the lower cooling part 31 by, for example, solder. The cooling surface 31A is a surface parallel to the XY plane.

The lower cooling part 31 has a cooling surface 31Ba provided to face the DC terminal 13 of the semiconductor module 10a. The lower cooling part 31 has a cooling surface 31Bb provided to face the DC terminal 13 of the semiconductor module 10b. Further, the lower cooling part 31 has a cooling surface 31Bc provided to face the DC terminal 13 of the semiconductor module 10c. The cooling surface 31Ba, the cooling surface 31Bb, and the cooling surface 31Bc are surfaces parallel to the XY plane.

Each of the cooling surface 31Ba, the cooling surface 31Bb, and the cooling surface 31Bc is adjacent to the cooling surface 31A. Each of the cooling surface 3lBa, the cooling surface 3lBb, and the cooling surface 3lBc extends in the same direction as the cooling surface 31A. Furthermore, the cooling surface 31A, the cooling surface 3lBa, the cooling surface 3lBb, and the cooling surface 3lBc are formed on the same plane.

The lower cooling part 31 has a cooling surface 31C in contact with the sheet 22 of the capacitor module 20. The cooling surface 31C is a surface parallel to the YZ plane. Furthermore, the cooling surface 31C extends in a direction intersecting each of the cooling surface 31A, the cooling surface 31Ba, the cooling surface 31Bb, and the cooling surface 31Bc.

The lower cooling part 31 includes refrigerant flow paths 31i and refrigerant flow paths 31j, through which the refrigerant flows.

The refrigerant flow path 31i is a flow path through which the refrigerant introduced into the refrigerant inlet/outlet portion 32 from the outside flows from left to right in the Y-axis direction. The refrigerant flowing through the refrigerant flow path 31i mainly performs heat exchange with each of the semiconductor module 10a, the semiconductor module 10b, and the semiconductor module 10c mounted on the cooling surface 31A.

The refrigerant flow path 31j is a flow path through which the refrigerant flowing through the refrigerant flow path 31i flows from right to left in the Y-axis direction. The refrigerant flowing through the refrigerant flow path 31j performs heat exchange with the semiconductor module 10a, the semiconductor module 10b, and the semiconductor module 10c at respective bonded parts via the cooling surface 31Ba, the cooling surface 31Bb, and the cooling surface 31Bc, respectively. The bonded parts are parts at which each of the semiconductor module 10a, the semiconductor module 10b, and the semiconductor module 10c is bonded with the capacitor module 20. The refrigerant flowing through the refrigerant flow path 31j also performs heat exchange with the capacitor module 20 via the cooling surface 31C.

Furthermore, the lower cooling part 31 includes a projecting portion 31a, a projecting portion 31b, a projecting portion 31c, and a projecting portion 31d on which the upper cooling part 33 is placed. Each of the projecting portion 31a, the projecting portion 31b, the projecting portion 31c, and the projecting portion 31d is formed so as to protrude upward with respect to the cooling surface 31A, the cooling surface 31Ba, the cooling surface 31Bb, and the cooling surface 31Bc. Each of the projecting portion 31a, the projecting portion 31b, the projecting portion 31c, and the projecting portion 31d also has a screw hole formed to fasten a screw 38 for fixing the upper cooling part 33.

The lower cooling part 31 has the cooling surface 31Ba between the projecting portion 31a and the projecting portion 31b. The space SPa is formed between the projecting portion 31a and the projecting portion 31b. The lower cooling part 31 has the cooling surface 31Bb between the projecting portion 31b and the projecting portion 31c. The space SPb is formed between the projecting portion 31b and the projecting portion 31c. The lower cooling part 31 has the cooling surface 31Bc between the projecting portion 31c and the projecting portion 31d. The space SPc is formed between the projecting portion 31c and the projecting portion 31d.

The cooling module 30 includes an insulating member 35a that covers the lower cooling part 31 side in the space SPa, in other words, the right side surface of the projecting portion 31a, the cooling surface 31Ba, and the left side surface of the projecting portion 31b. The insulating member 35a electrically insulates the DC terminal 12 and the DC terminal 13 of the semiconductor module 10a and the capacitor terminal 23ta and the capacitor terminal 24ta of the capacitor module 20 from the lower cooling part 31.

The cooling module 30 includes an insulating member 35b that covers the lower cooling part 31 side in the space SPb, in other words, the right side surface of the projecting portion 31b, the cooling surface 31Bb, and the left side surface of the projecting portion 31c. The insulating member 35b electrically insulates the DC terminal 12 and the DC terminal 13 of the semiconductor module 10b and the capacitor terminal 23tb and the capacitor terminal 24tb of the capacitor module 20 from the lower cooling part 31.

The cooling module 30 includes an insulating member 35c that covers the lower cooling part 31 side in the space SPc, in other words, the right side surface of the projecting portion 31c, the cooling surface 31Bc, and the left side surface of the projecting portion 31d. The insulating member 35c electrically insulates the DC terminal 12 and the DC terminal 13 of the semiconductor module 10c and the capacitor terminal 23tc and the capacitor terminal 24tc of the capacitor module 20 from the lower cooling part 31.

(Refrigerant Inlet/Outlet Portion 32)

The refrigerant inlet/outlet portion 32 receives a refrigerant from the outside and discharges the refrigerant to the outside. The refrigerant inlet/outlet portion 32 also introduces the refrigerant introduced from the outside into the lower cooling part 31. Furthermore, the refrigerant inlet/outlet portion 32 collects the refrigerant that has passed through the inside of the lower cooling part 31 and increased in temperature and discharges the refrigerant to the outside.

The refrigerant inlet/outlet portion 32 includes a pipe 32p1 and a pipe 32p2. The pipe 32p1 is connected to an external refrigerant supplying device. A cooled refrigerant is supplied to the pipe 32p1 from the external refrigerant supplying device. The pipe 32p2 is connected to an external refrigerant recovery device. The heated refrigerant is discharged from the pipe 32p1 to the external refrigerant recovery device.

(Upper Cooling Part 33)

The upper cooling part 33 cools the bonded parts at which each of the semiconductor module 10a, the semiconductor module 10b, and the semiconductor module 10c is bonded with the capacitor module 20. The upper cooling part 33 also cools the capacitor module 20.

The upper cooling part 33 is disposed on the projecting portion 31a, the projecting portion 31b, the projecting portion 31c, and the projecting portion 31d of the lower cooling part 31. The cooling module 30 includes an insulating member 34 between the lower cooling part 31 and the upper cooling part 33. The insulating member 34 has a plate shape extending in the X-axis direction and the Y-axis direction. The insulating member 34 electrically insulates the DC terminals 12 of the semiconductor module 10a, the semiconductor module 10b, and the semiconductor module 10c from the upper cooling part 33. The upper cooling part 33 is fastened to the lower cooling part 31 with the screws 38.

The screw 38 transfers heat between the upper cooling part 33 and the lower cooling part 31. By fastening the upper cooling part 33 to the lower cooling part 31 with the screws 38, the DC terminals of the semiconductor modules 10 and the capacitor terminals of the capacitor module 20 are pressed toward the lower cooling part 31. By pressing the DC terminals of the semiconductor modules 10 and the capacitor terminals of the capacitor module 20 toward the lower cooling part 31, heat transfer at the bonded parts between the DC terminals of the semiconductor modules 10 and the capacitor terminals of the capacitor module 20 can be promoted.

The upper cooling part 33 has a cooling surface 33A that is in contact with the sheet 22 of the capacitor module 20. The upper cooling part 33 also has cooling surfaces 33B so as to face each of the bonded parts between each of the DC terminals of the semiconductor module 10a, the semiconductor module 10b, and the semiconductor module 10c, and the respective capacitor terminals of the capacitor module 20.

Heat Dissipation in Power Converter According to Present Embodiment

Figure 26:
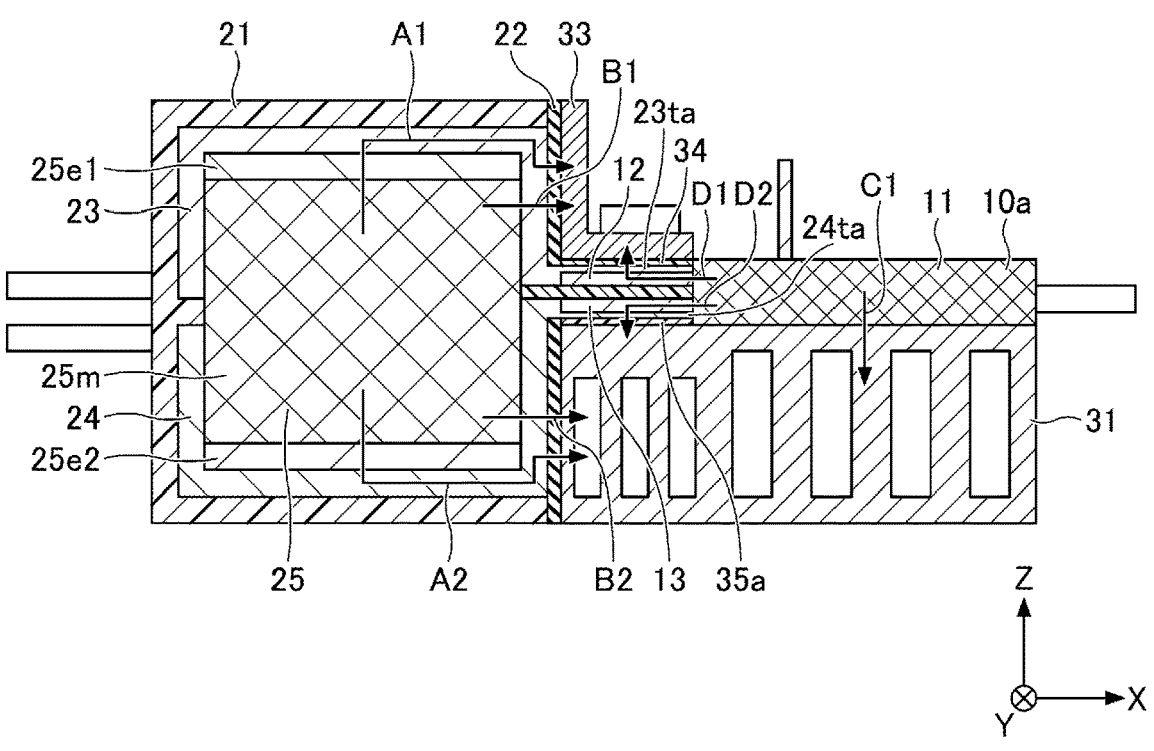
FIG. 26 is a diagram illustrating a flow of heat in the power converter according to the present embodiment.
Figure 27:
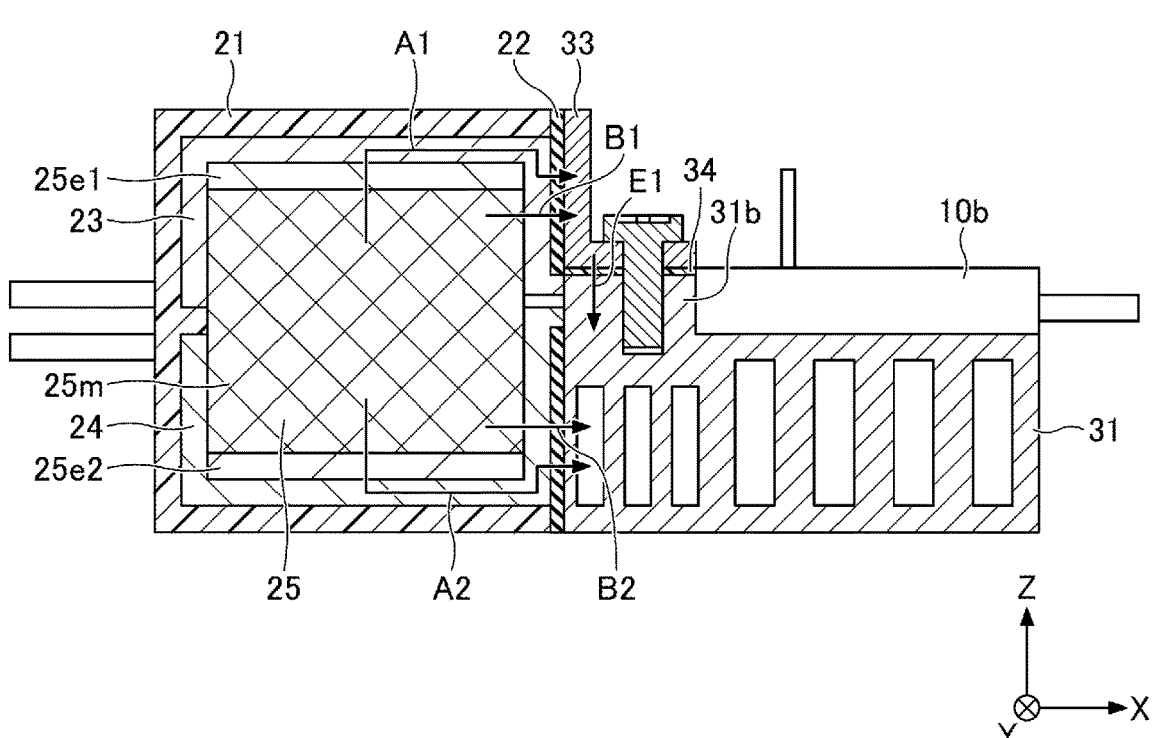
FIG. 27 is another diagram illustrating the flow of heat in the power converter according to the present embodiment.

Heat dissipation in the power converter according to the present embodiment will now be described. FIG. 26 and FIG. 27 are diagrams illustrating the flow of heat in the power converter 1 which is the example of the power converter according to the present embodiment. FIG. 26 is a cross-sectional view taken along line IV-IV in FIG. 2. FIG. 27 is a cross-sectional view taken along line V-V in FIG. 2. In FIG. 26, the internal structure of the semiconductor module 10a is omitted. Here, a description will be given using the semiconductor module 10a. The same applies to the semiconductor module 10b and the semiconductor module 10c.

Heat in the capacitor element 25 is transferred to the upper cooling part 33 of the cooling module 30 via the capacitor body portion 25m, the electrode 25e1, the bus bar 23, and the sheet 22 as indicated by an arrow A1. Heat in the capacitor element 25 is also transferred to the lower cooling part 31 of the cooling module 30 via the capacitor body portions 25m, the electrode 25e2, the bus bar 24, and the sheet 22 as indicated by an arrow A2. Heat in the capacitor element 25 is transferred through the paths indicated by the arrow A1 and the arrow A2, thereby the capacitor element 25 can be effectively cooled.

Heat in the capacitor element 25 is transferred to the upper cooling part 33 of the cooling module 30 via the capacitor body portion 25m, the bus bar 23, and the sheet 22 as indicated by an arrow B1. Heat in the capacitor elements 25 is also transferred to the lower cooling part 31 of the cooling module 30 via the capacitor body portion 25m, the bus bar 24, and the sheet 22 as indicated by an arrow B2. Heat in the capacitor element 25 is transferred through the paths indicated by the arrow B1 and the arrow B2, thereby the capacitor element 25 can be effectively cooled.

In the semiconductor module 10, as indicated by an arrow C1, heat generated in the switching elements provided inside the package portion 11 is transferred from the dissipation plate 17 to the lower cooling part 31 of the cooling module 30. Heat in the semiconductor module 10 is transferred through the path indicated by the arrow C1, thereby the semiconductor module 10, in particular, the switching elements included in the semiconductor module 10 can be effectively cooled.

The cooling module 30 in the power converter 1 cools the bonded parts at which each of the semiconductor module 10a, the semiconductor module 10b, and the semiconductor module 10c is bonded with the capacitor module 20. In the case of the semiconductor module 10a, at the bonded part between the capacitor module 20 and the semiconductor module 10a, the capacitor terminal 24ta, the DC terminal 13, the insulating member 18, the DC terminal 12, and the capacitor terminal 23ta are stacked in this order from the bottom. Note that the capacitor terminal 24ta and the DC terminal 13 may be stacked in the reverse order. Similarly, the capacitor terminal 23ta and the DC terminal 12 may be stacked in the reverse order. The same applies to each of the semiconductor module 10b and the semiconductor module 10c.

As indicated by an arrow D1, heat in the semiconductor module 10 is transferred to the upper cooling part 33 of the cooling module 30 via the DC terminal 12, the capacitor terminal 23ta, and the insulating member 34. Heat in the semiconductor module 10 is also transferred to the lower cooling part 31 of the cooling module 30 via the DC terminal 13, the capacitor terminal 24ta, and the insulating member 35a, as indicated by an arrow D2. Heat in the semiconductor module 10 is transferred through the paths indicated by the arrow D1 and an arrow D2, thereby the semiconductor module 10 can be effectively cooled.

Heat transferred to the upper cooling part 33 is transferred to the projecting portion 31b of the lower cooling part 31 via the insulating member 34 as indicated by an arrow E1. Heat transferred to the upper cooling part 33 is transferred through a path indicated by the arrow E1, thereby the upper cooling part 33 can be effectively cooled by the lower cooling part 31.

As illustrated in FIG. 26, in the semiconductor module 10a, the DC terminal 12 and the DC terminal 13 and the capacitor terminal 23ta and the capacitor terminal 24ta extend in the same direction. As is apparent from the structure of the semiconductor module 10 illustrated in FIG. 5 to FIG. 8 and the semiconductor module 10a illustrated in FIG. 26, the dissipation plate 17 in the semiconductor module 10a extends in the same direction as the DC terminal 12 and the DC terminal 13 and the capacitor terminal 23ta and the capacitor terminal 24ta. The same applies to each of the semiconductor module 10b and the semiconductor module 10c.

SUMMARY

According to the power converter of the present embodiment, effective heat dissipation can be achieved. According to the power converter of the present embodiment, it is possible to achieve effective heat dissipation without incorporating a cooling mechanism in the capacitor module, and to reduce the size and manufacturing cost of the power converter.

According to the power converter of the present embodiment, since a third cooling surface extends in a direction intersecting with each of a first cooling surface and a second cooling surface, it is possible to cool the semiconductor module using the upper surface of the cooling module and cool the capacitor module using the side surface of the cooling module. According to the power converter of the present embodiment, the semiconductor module and the capacitor module can be efficiently cooled by using the upper surface and the side surface of the cooling module. Furthermore, according to the power converter of the present embodiment, the power converter can be miniaturized by using the upper surface and the side surface of the cooling module. Furthermore, according to the power converter of the present embodiment, it is possible to suppress the manufacturing cost of the power converter by using the upper surface and the side surface of the cooling module.

According to the power converter of the present embodiment, the heat dissipation path between the capacitor module 20 and the cooling module 30 can be shortened. By shortening the heat dissipation path, the capacitor module 20 can be efficiently cooled by dissipating heat. Heat generated by the switching elements included in the semiconductor module 10 can also be cooled by the cooling module 30 via the dissipation plate.

Further, according to the power converter of the present embodiment, the semiconductor module 10, the capacitor module 20, and the cooling module 30 are integrated with each other, so that a dead space in the power converter 1 can be reduced. By reducing the dead space, the volume of the power converter can be reduced. Since the capacitor module and the semiconductor module are arranged close to each other, the length of each terminal can be shortened, the loss can be reduced by reducing the wiring impedance, and the cooling module can be miniaturized.

Furthermore, according to the power converter of the present embodiment, the structures of the capacitor module and the cooling module do not need to be largely changed from a general capacitor structure and a structure of a cooling module for cooling a single semiconductor module, and thus the manufacturing cost can be suppressed.

The heat dissipation plate 17 is an example of a heat dissipation portion, the cooling surface 31A is an example of a first cooling surface, each of the cooling surface 31Ba, the cooling surface 31Bb, and the cooling surface 31Bc is an example of a second cooling surface, and the cooling surface 31C is an example of a third cooling surface. The electrode 25e2 is an example of a first electrode, the electrode 25e1 is an example of a second electrode, the bus bar 24 is an example of a first bus bar, and the bus bar 23 is an example of a second bus bar. Each of the DC terminals 13 of the semiconductor module 10a, the semiconductor module 10b, and the semiconductor module 10c is an example of a first DC terminal, and each of the DC terminals 12 thereof is an example of a second DC terminal. Each of the capacitor terminal 24ta, the capacitor terminal 24tb, and the capacitor terminal 24tc is an example of a first capacitor terminal, and each of the capacitor terminal 23ta, the capacitor terminal 23tb, and the capacitor terminal 23tc is an example of a second capacitor terminal.

According to the power converter of the present disclosure, effective heat dissipation can be achieved.

What is claimed is:

1. A power converter comprising:
a semiconductor module including a switching element, a DC terminal, an AC terminal, and a heat dissipation portion;
a capacitor module including a capacitor terminal coupled to the DC terminal of the semiconductor module; and
a cooling module having
a first cooling surface provided to face the heat dissipation portion,
a second cooling surface provided to face the DC terminal or the capacitor terminal, and
a third cooling surface extending in a direction intersecting each of the first cooling surface and the second cooling surface, the third cooling surface being configured to cool the capacitor module,
wherein the first cooling surface and the second cooling surface are coplanar, and define a first module surface of the cooling module, and
wherein the third cooling surface defines a second module surface of the cooling module, the second module surface being adjacent to and perpendicular to the first module surface.

2. The power converter according to claim 1, wherein the capacitor module includes
a capacitor element,
a bus bar electrically coupled to the capacitor element and including the capacitor terminal, and
an insulating sheet covering the bus bar, the insulating sheet being provided between the bus bar and the third cooling surface.

3. The power converter according to claim 1, wherein the semiconductor module includes the DC terminal and a heat dissipation plate, the heat dissipation plate constituting the heat dissipation portion, and facing the first cooling surface, and
wherein the DC terminal, the heat dissipation plate, and the capacitor terminal extend in a same direction.

4. The power converter according to claim 1, wherein the cooling module includes a refrigerant flow path through which a refrigerant is configured to flow, wherein the second cooling surface is adjacent to the first cooling surface, and extends in a same direction as the first cooling surface, and wherein the first cooling surface, the second cooling surface, and the third cooling surface are configured such that heat from each of the first cooling surface, the second cooling surface, and the third cooling surface is dissipated by the refrigerant flowing through the refrigerant flow path.

5. The power converter according to claim 1, wherein the cooling module includes a lower cooling part having the first cooling surface, the second cooling surface, and the third cooling surface, and an upper cooling part, and wherein the capacitor module includes a capacitor element including a first electrode and a second electrode, a first bus bar electrically coupled to the first electrode, a second bus bar electrically coupled to the second electrode, and an insulating sheet covering the first bus bar and the second bus bar, the insulating sheet being provided between the first bus bar and the third cooling surface, and being provided between the second bus bar and the upper cooling part.

6. The power converter according to claim 1, wherein the cooling module includes a lower cooling part having the first cooling surface, the second cooling surface, and the third cooling surface, and an upper cooling part, and wherein the DC terminal and the capacitor terminal are provided between the second cooling surface and the upper cooling part.

7. The power converter according to claim 1, wherein the capacitor terminal includes a step on which the DC terminal is arranged.

8. A power converter comprising:

a semiconductor module including a switching element, a first DC terminal, a second DC terminal, an AC terminal, and a heat dissipation portion;

a capacitor module including a first capacitor terminal coupled to the first DC terminal, and a second capacitor terminal coupled to the second DC terminal; and a cooling module including a lower cooling part and an upper cooling part, the lower cooling part having a first cooling surface provided to face the heat dissipation portion of the semiconductor module, a second cooling surface provided to face any one of the first DC terminal, the second DC terminal, the first capacitor terminal, and the second capacitor terminal, and a third cooling surface extending in a direction intersecting each of the first cooling surface and the second cooling surface, the third cooling surface being configured to cool the capacitor module, wherein the first capacitor terminal, the first DC terminal, the second capacitor terminal, and the second DC terminal are arranged between the lower cooling part and the upper cooling part, wherein the first cooling surface and the second cooling surface are coplanar, and define a first module surface at the lower cooling part of the cooling module, and wherein the third cooling surface defines a second module surface at the lower cooling part of the cooling module, the second module surface being adjacent to and perpendicular to the first module surface.

* * * * *